United States Patent [19]

Cheng et al.

[11] Patent Number: 5,525,982
[45] Date of Patent: Jun. 11, 1996

[54] METHOD AND MEANS FOR CHARACTER STRING PATTERN MATCHING FOR COMPRESSION AND THE LIKE USING MINIMAL CYCLES PER CHARACTER

[75] Inventors: Joe-Ming Cheng; Yancy Cheng, both of San Jose, Calif.

[73] Assignee: International Business Machines Corporation, Armonk, N.Y.

[21] Appl. No.: 228,321

[22] Filed: Apr. 15, 1994

[51] Int. Cl.$^6$ .................................................. H03M 7/30
[52] U.S. Cl. ............................................. 341/51; 341/106
[58] Field of Search .................................. 341/51, 95, 106

[56] References Cited

U.S. PATENT DOCUMENTS

| | | | |
|---|---|---|---|
| 4,054,951 | 10/1977 | Jackson et al. | 364/900 |
| 5,003,307 | 3/1991 | Whiting et al. | 341/51 |
| 5,179,378 | 1/1993 | Ranganathan et al. | 341/51 |
| 5,329,405 | 7/1994 | Hou et al. | 395/800 |
| 5,339,076 | 8/1994 | Jiang | 341/51 |
| 5,369,605 | 11/1994 | Parks | 364/715.09 |
| 5,373,290 | 12/1994 | Lempel et al. | 341/51 |
| 5,384,568 | 12/1994 | Lempel et al. | 341/51 |

OTHER PUBLICATIONS

Ziv et al., "Universal Algorithm for Sequential Data Compression", IEEE Trans. on Information Theory, vol. IT-23, No. 3, May 1977, pp. 337–343.
Ziv et al., "Compression of Individual Sequences via Variable–Rate Coding", IEEE Trans. on Information Theory, vol. IT-24, NO. 5, Sep. 1978, pp. 530–536.

*Primary Examiner*—Marc S. Hoff
*Attorney, Agent, or Firm*—Baker, Maxham, Jester & Meador

[57] ABSTRACT

A method and means for ascertaining maximal length pattern matches of K characters per cycle between character strings in a reduced amount of time using a pipeline like concurrent dataflow model in which a recursive exhaustive greedy comparison matching between the strings in consistent direction yields a parsing of the longest matches, the recursion being constrained by relations among K, the match length L, and a tracking variable J, said constraints governing further recursions ascertaining prefix extensions from one string to another and any intra-string pattern matches. Embodiments processing K equal to one, two, or three characters at a time are disclosed.

16 Claims, 13 Drawing Sheets

HIGH LEVEL PATTERN MATCHING LOGIC FOR LZ1977 COMPRESSION ACCORDING TO THE INVENTION

PIPELINED CONCURRENT DATAFLOW HIGH LEVEL PATTERN MATCHING LOGIC FOR LZ1977 COMPRESSION ACCORDING TO THE INVENTION

CAM TYPE LZ1977 COMPRESSION ENCODER AND MAIN PROCESSING LOOP

LOOP UNTIL DONE

0  READ INPUT (BYTE) AND MAKE COPY, GLOBAL MATCH SEARCH AND WRITE THIS BYTE INTO CAM POINTED TO BY A WRITE SELECT REGISTER.

1  CHECK (CONDITION)

2  CONDITION: (STRING COUNT IS 0 AND NO MATCH)
    SHIP RAW BYTE OUT

3  CONDITION: (STRING COUNT IS 0 AND AT LEAST ONE MATCH FOUND)
    COPY MATCH TO PS, INCREMENT STRING COUNT, SHIFT (ROTATE) PS ;
    /* COULD BE THE 1ST CHAR OF A NEW MATCH STRING */

4  CONDITION: (STRING COUNT >= 1 AND PS_SET IS 1)
    INCREMENT STRING COUNT, SHIFT (ROTATE) PS /* MATCH GETS LONGER */

5  CONDITION: (STRING COUNT >=2 AND PS_IS 0) /* CURRENT MATCH ENDS */
    RELEASE COMPRESSED_TOKEN;

6        IF (NO MATCH)
            SHIP RAW BYTE, RESET STRING COUNT TO 0,

7        IF (MATCH) /* POSSIBLE BACK-TO-BACK MATCH CASE */
            COPY MATCH TO PS, INCREMENT STRING COUNT, SHIFT (ROTATE) PS

8  CONDITION: STRING COUNT ==1 AND NO PS_SET
9        SHIP PREVIOUS RAW BYTE OUT
10       IF (NO MATCH)
            SHIP PRESENT RAW BYTE OUT,
11       ELSE
            COPY MATCH TO PS, INCREMENT STRING COUNT, SHIFT (ROTATE) PS ;
            /* COULD BE THE FIRST CHAR OF A NEW MATCH STRING */

12  CONDITION END, RETURN TO 0;

CAM TYPE LZ1977 COMPRESSION ENCODER AND MAIN PROCESSING LOOP
(PRIOR ART)

FIG. 1B

HIGH LEVEL PATTERN MATCHING LOGIC FOR LZ1977
COMPRESSION ACCORDING TO THE INVENTION

PIPELINED CONCURRENT DATAFLOW HIGH LEVEL PATTERN MATCHING LOGIC FOR LZ1977 COMPRESSION ACCORDING TO THE INVENTION

PATTERN MATCHING LOGIC FOR ONE CHARACTER PER CYCLE ENCODING

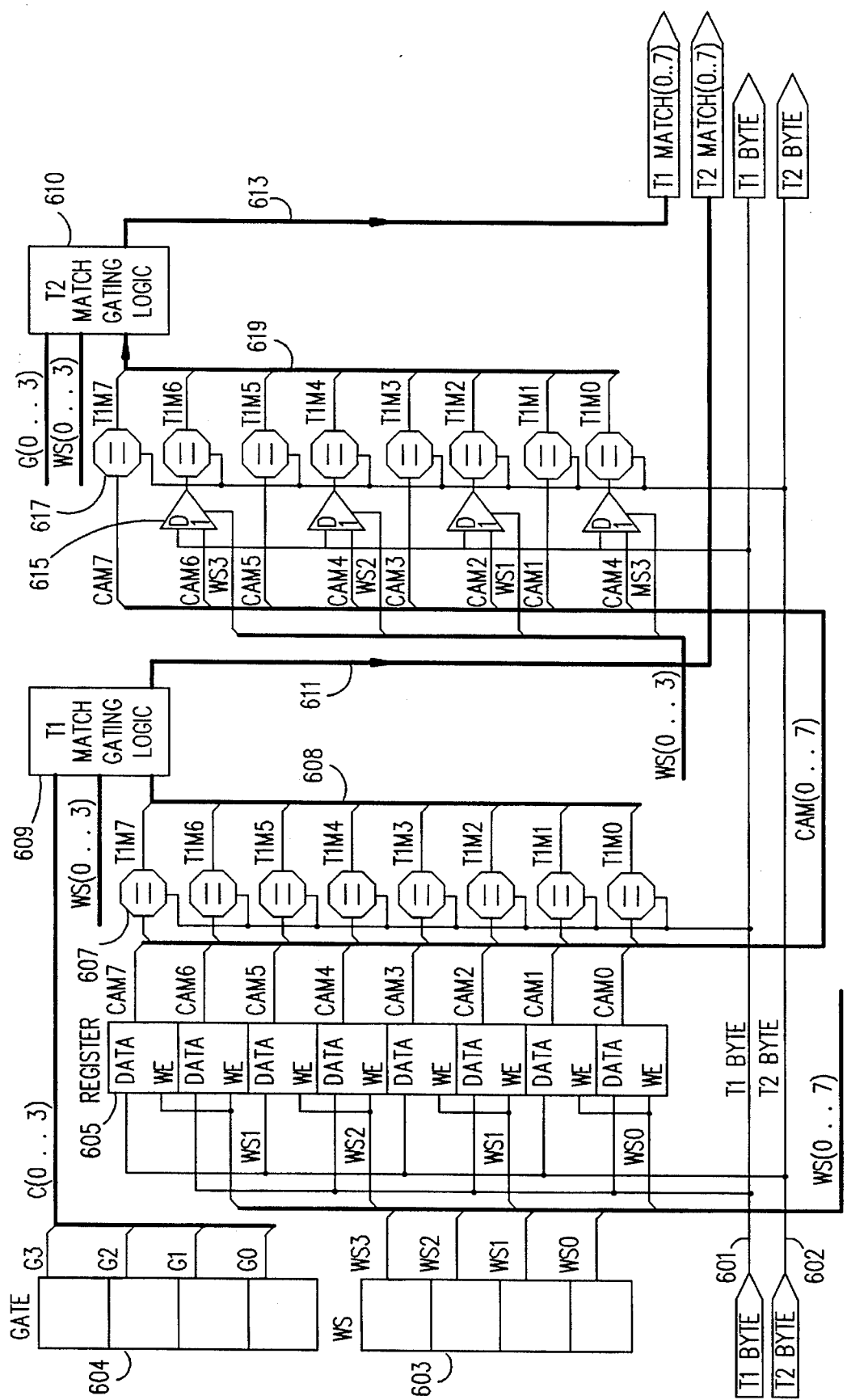
FIG. 4A  PATTERN MATCHING LOGIC FOR TWO CHARACTERS PER CYCLE ENCODING

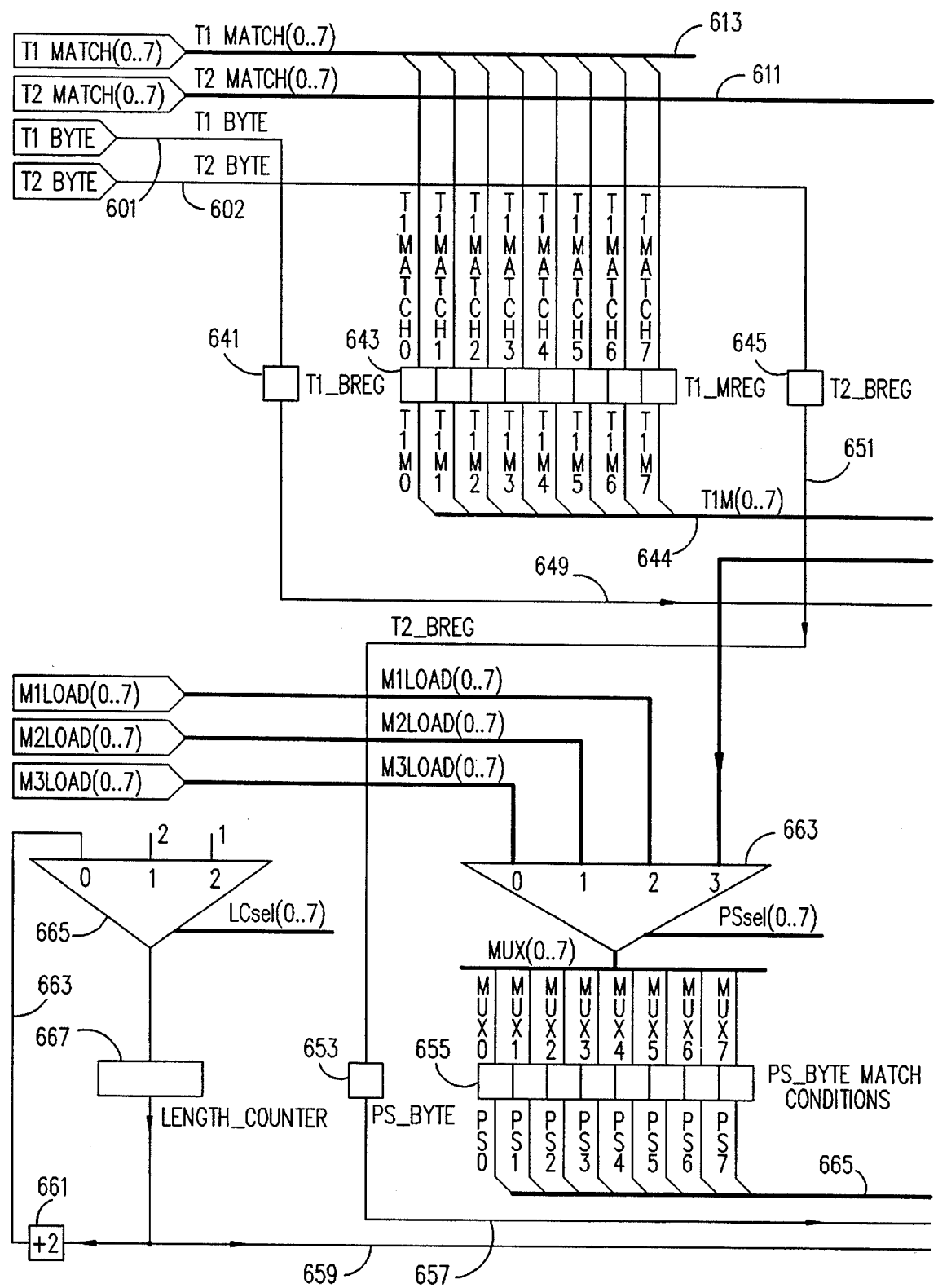
FIG. 4B.1

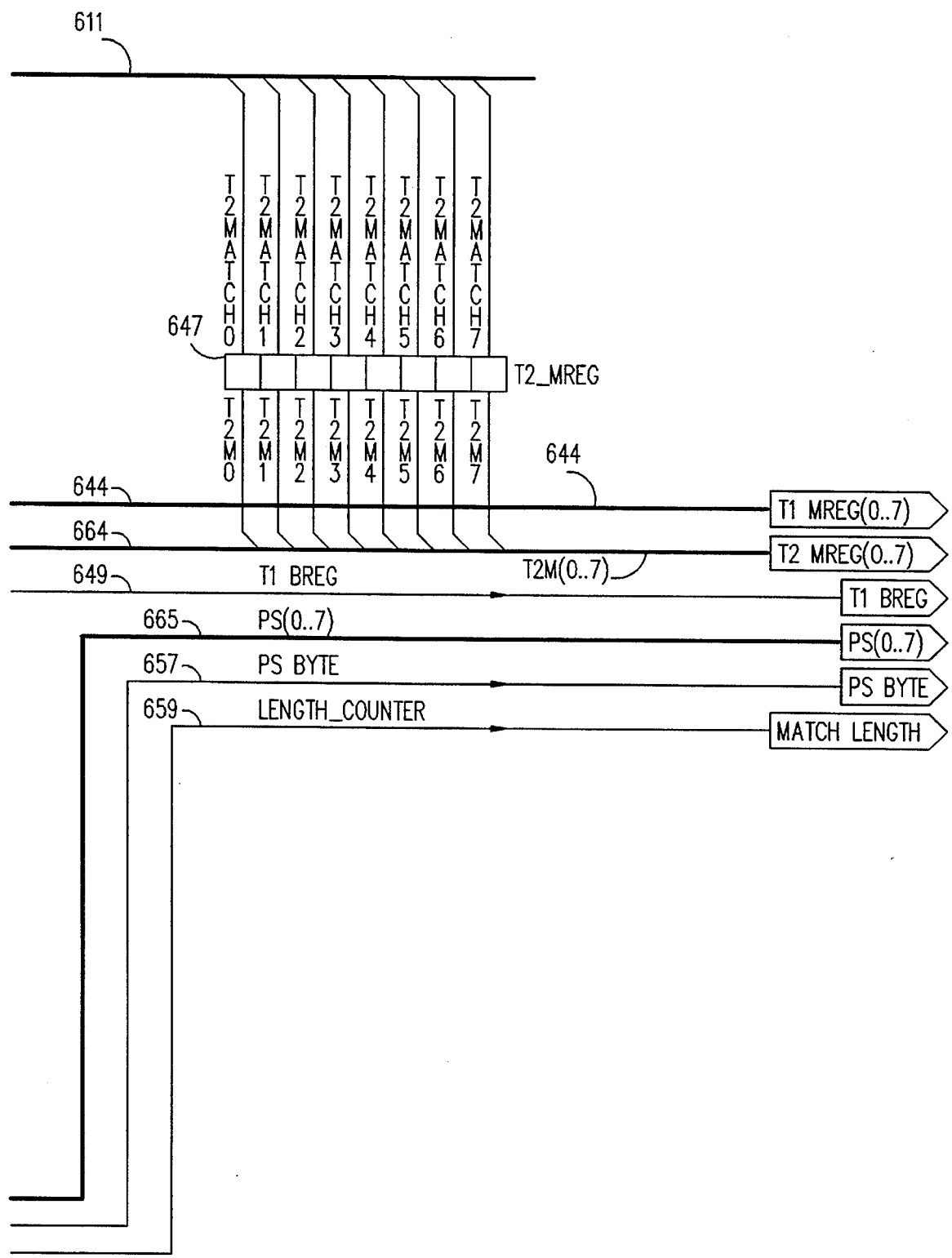
FIG. 4B.2

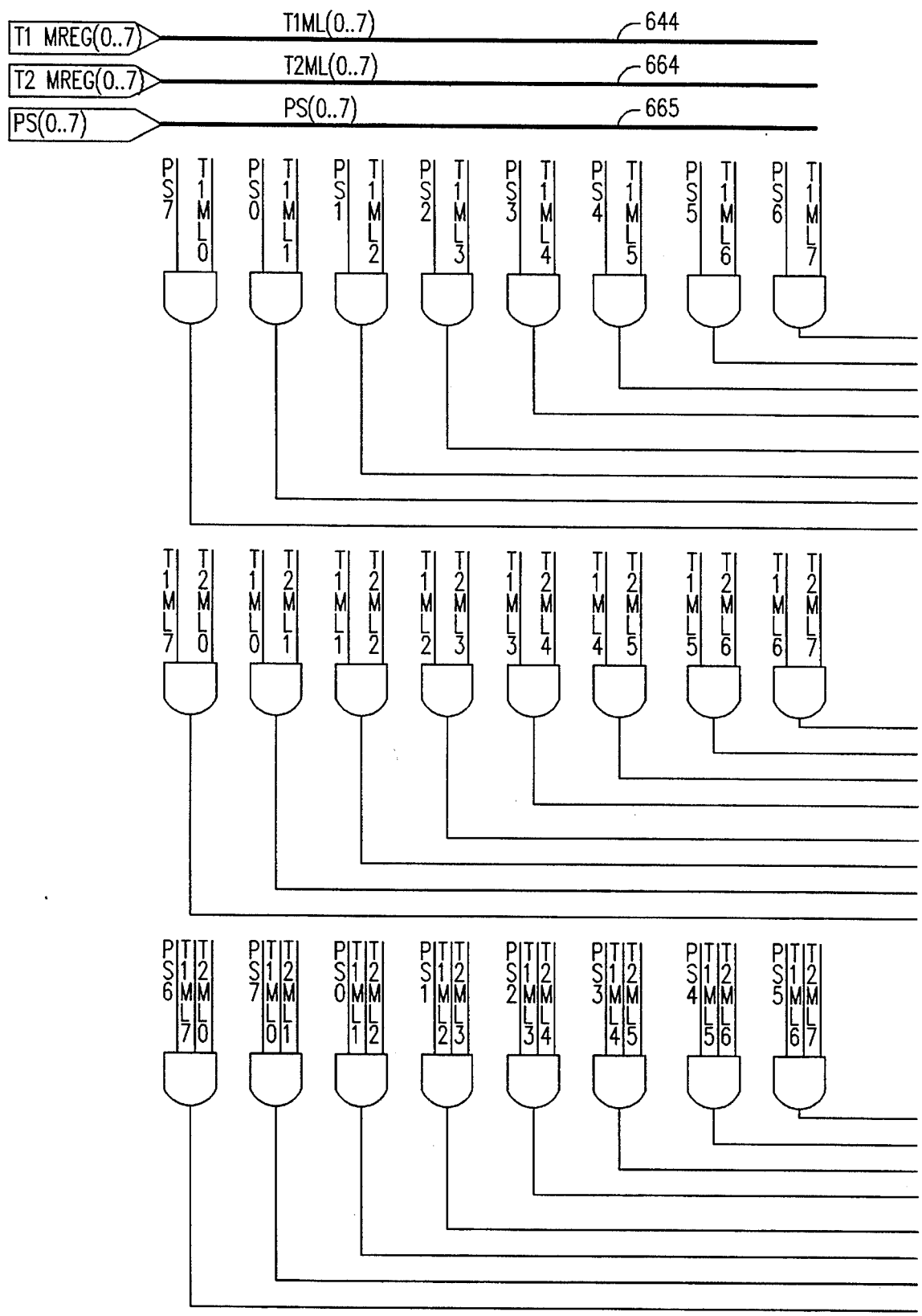
FIG. 4C.1

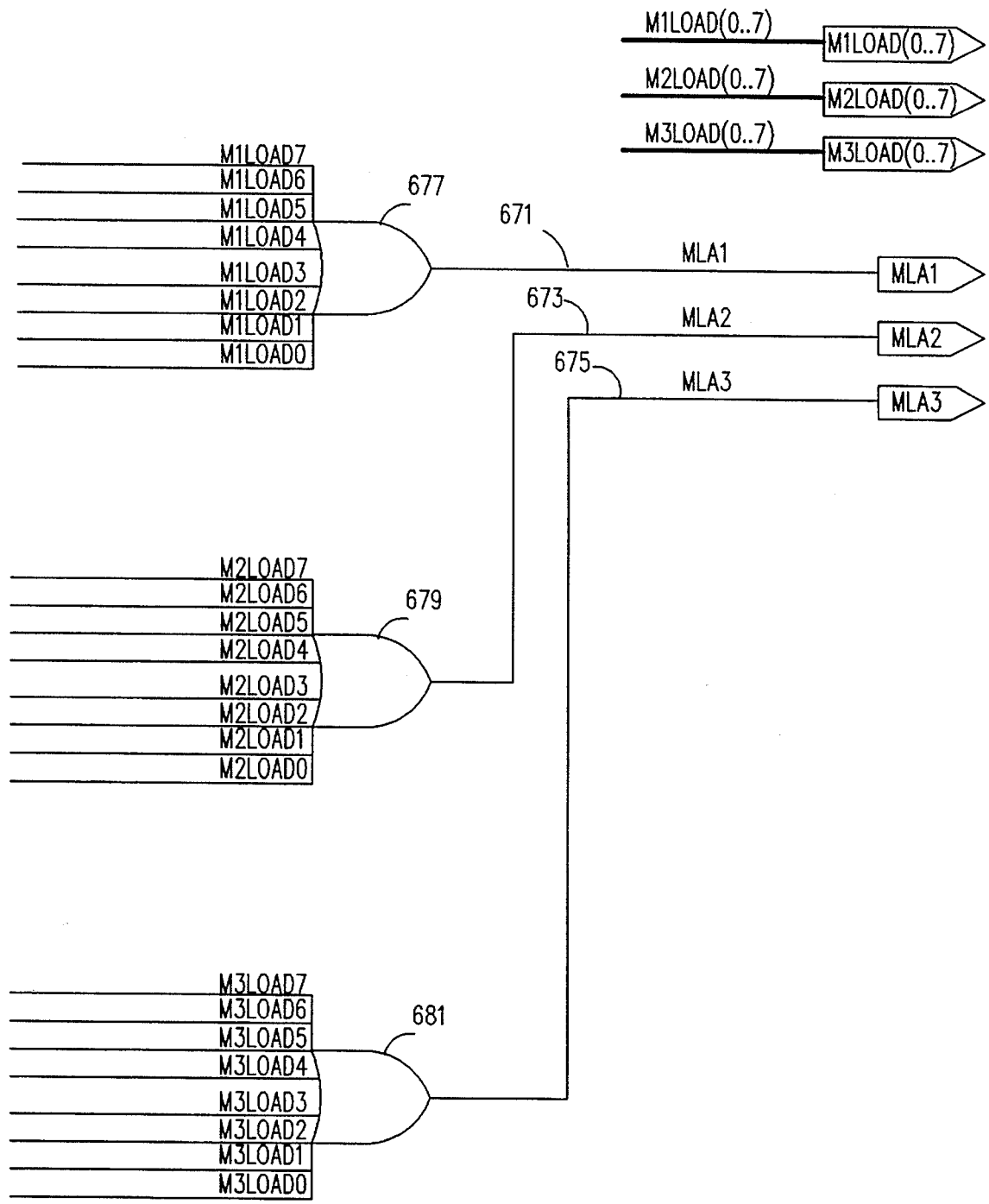
FIG. 4C.2

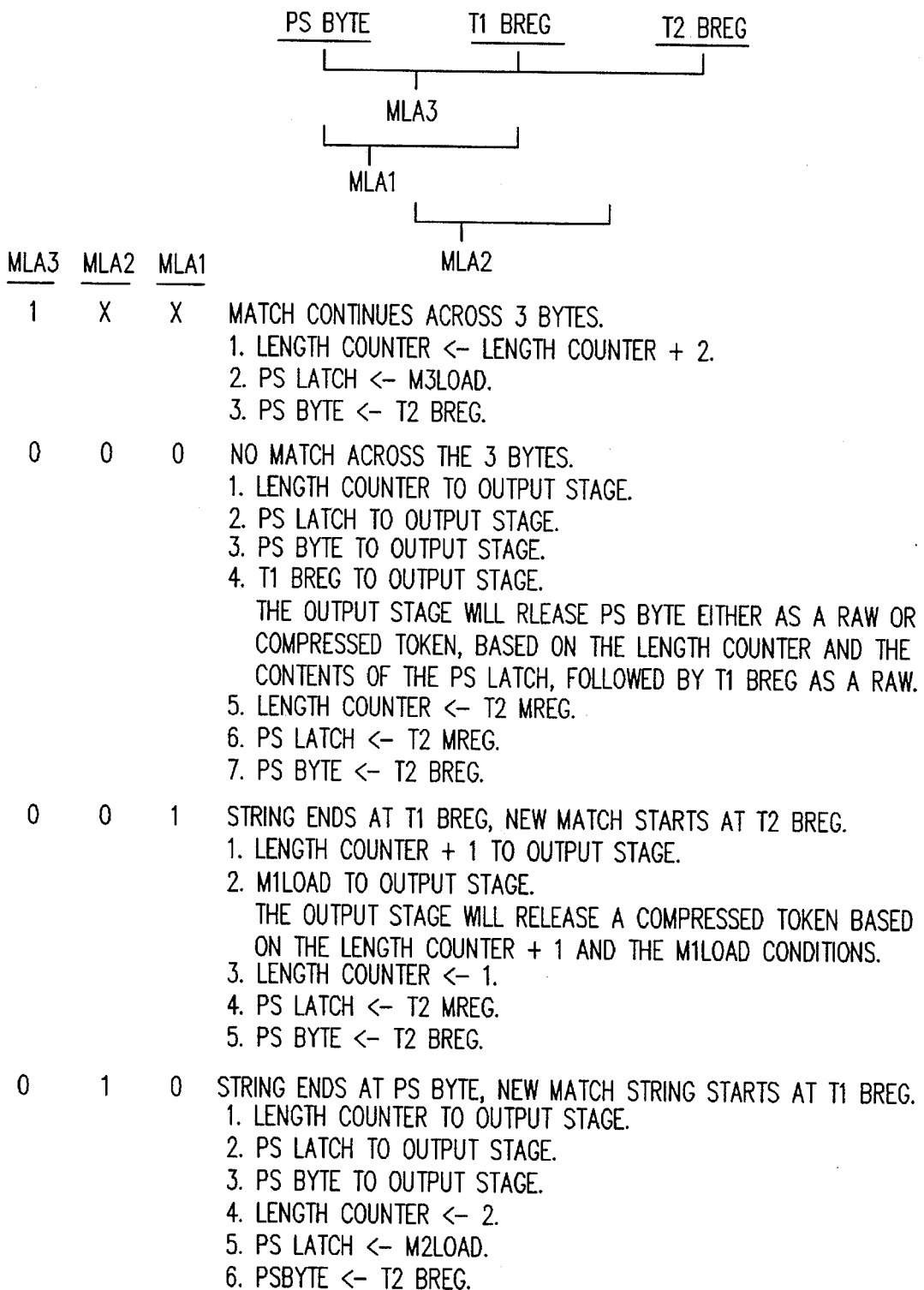

```
          PS BYTE      T1 BREG      T2 BREG
          └────┬──────────┘            │
               │         └─────────────┤
              MLA3                     │
          └────┬──────────────────┘
              MLA1
                         └─────┬───────┘
MLA3 MLA2 MLA1                MLA2

1   X   X   MATCH CONTINUES ACROSS 3 BYTES.
             1. LENGTH COUNTER <- LENGTH COUNTER + 2.
             2. PS LATCH <- M3LOAD.
             3. PS BYTE <- T2 BREG.

0   0   0   NO MATCH ACROSS THE 3 BYTES.
             1. LENGTH COUNTER TO OUTPUT STAGE.
             2. PS LATCH TO OUTPUT STAGE.
             3. PS BYTE TO OUTPUT STAGE.
             4. T1 BREG TO OUTPUT STAGE.
                THE OUTPUT STAGE WILL RLEASE PS BYTE EITHER AS A RAW OR
                COMPRESSED TOKEN, BASED ON THE LENGTH COUNTER AND THE
                CONTENTS OF THE PS LATCH, FOLLOWED BY T1 BREG AS A RAW.
             5. LENGTH COUNTER <- T2 MREG.
             6. PS LATCH <- T2 MREG.
             7. PS BYTE <- T2 BREG.

0   0   1   STRING ENDS AT T1 BREG, NEW MATCH STARTS AT T2 BREG.
             1. LENGTH COUNTER + 1 TO OUTPUT STAGE.
             2. M1LOAD TO OUTPUT STAGE.
                THE OUTPUT STAGE WILL RELEASE A COMPRESSED TOKEN BASED
                ON THE LENGTH COUNTER + 1 AND THE M1LOAD CONDITIONS.
             3. LENGTH COUNTER <- 1.
             4. PS LATCH <- T2 MREG.
             5. PS BYTE <- T2 BREG.

0   1   0   STRING ENDS AT PS BYTE, NEW MATCH STRING STARTS AT T1 BREG.
             1. LENGTH COUNTER TO OUTPUT STAGE.
             2. PS LATCH TO OUTPUT STAGE.
             3. PS BYTE TO OUTPUT STAGE.
             4. LENGTH COUNTER <- 2.
             5. PS LATCH <- M2LOAD.
             6. PSBYTE <- T2 BREG.
```

FLOW OF CONTROL AND THE SELECTED REGISTER STATES IN FORMING THE MATCH LOOK-ALIKE SIGNALS IN THE TWO CHARACTER PER ENCODING CYCLE EMBODIMENT

FIG. 5A 0   1   1   STRING ENDS AT T1 BREG, NEW MATCH STARTS AT T2 BREG.
CONSIDER THIS CASE FOR THE 1 BYTE CAM.
WHEN T1 BREG COMES IN, MLA IS 1, AND THE
MLA CONDITIONS ARE LOADED INTO THE PS LATCH.
WHEN T2 BREG COMES IN MLA IS 1, AND THE
MLA CONDITIONS ARE LOADED INTO THE PS LATCH.
WHEN T2 BREG COMES IN, MLA IS 0 SINCE THERE
IS NO MATCH ACROSS ALL 3 BYTES. THUS THE
MATCH CONDITION ASSOCIATED WITH T2 BREG IS
LOADED INTO THE PS LATCH TO START A NEW MATCH.
1. LENGTH COUNTER + 1 TO OUTPUT STAGE.
2. M1LOAD TO OUTPUT STAGE.
   THE OUTPUT STAGE WILL RELEASE A COMPRESSED TOKEN
   BASED ON LENGTH COUNTER + 1 AND THE M1LOAD CONDITIONS.
3. LENGTH COUNTER <- 1.
4. PS LATCH <- T2 MREG.
5. PS BYTE <- T2 BREG.

FROM THE ABOVE, CONDITIONS 001 AND 011 CAN BE COMBINED.

0   X   1   STRING ENDS AT T1 BREG, NEW MATCH STARTS AT T2 BREG.
1. LENGTH COUNTER + 1 TO OUTPUT STAGE.
2. M1LOAD TO OUTPUT STAGE.
   THE OUTPUT STAGE WILL RELEASE A COMPRESSED TOKEN
   BASED ON LENGTH COUNTER + 1 AND THE M1LOAD CONDITIONS.
3. LENGTH COUNTER <- 1.
4. PS LATCH <- T2 MREG.
5. PS BYTE <- T2 BREG.

FLOW OF CONTROL AND REGISTER STATE IN FORMING MLA SIGNALS
FOR THE TWO CHARACTER PER CYCLE ENCODING

FIG. 5B

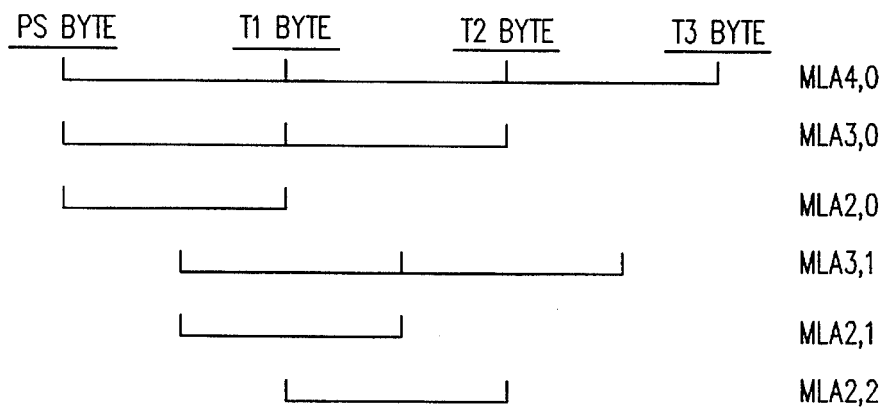

| MLA4,0 | MLA3,0 | MLA2,0 | MLA3,1 | MLA2,1 | MLA2,2 | |
|---|---|---|---|---|---|---|
| 1 | X | X | X | X | X | MATCH ACROSS 4 BYTES. |
| 0 | 1 | X | X | X | X | MATCH STRING ENDS AT T2 BREG, NEW STRING STARTS AT T3 BREG. |
| 0 | 0 | 1 | X | X | 0 | MATCH STRING ENDS AT T1 BREG, RAW BYTE AT T2 BREG, NEW MATCH STRING STARTS AT T3 BREG. |
| 0 | 0 | 1 | X | X | 1 | MATCH STRING ENDS AT T1 BREG, NEW MATCH STRING STARTS AT T2 BREG. |
| 0 | 0 | 0 | 1 | X | X | MATCH STRING ENDS AT PS BYTE, NEW MATCH STRING STARTS AT T1 BREG. |
| 0 | 0 | 0 | 0 | 1 | X | MATCH STRING ENDS AT PS BYTE, MATCH STRING STARTS AT T1 BREG AND ENDS AT T2 BREG, NEW MATCH STRING STARTS AT T3 BREG. |
| 0 | 0 | 0 | 0 | 0 | 1 | MATCH STRING ENDS AT PS BYTE, RAW BYTE AT T1 BREG, NEW MATCH STRING STARTS AT T2 BREG. |
| 0 | 0 | 0 | 0 | 0 | 0 | MATCH STRING ENDS AT PS BYTE, RAW BYTE AT T1 AND T2 BREGS, NEW MATCH STRING. |

FLOW OF CONTROL AND SELECTED REGISTER STATES IN FORMING THE MATCH LOOKAHEAD SIGNALS IN THE THREE CHARACTER PER ENCODING CYCLE EMBODIMENT

FIG. 6

METHOD AND MEANS FOR CHARACTER STRING PATTERN MATCHING FOR COMPRESSION AND THE LIKE USING MINIMAL CYCLES PER CHARACTER

FIELD OF THE INVENTION

This invention relates to minimizing the time for ascertaining the maximal length pattern match between a pair of character strings for use in adaptive dictionary character string compression or the like such as is expressed for instance by a Ziv-Lempel 1977 type compression coder.

DESCRIPTION OF RELATED ART

In this section compression methods are briefly summarized with emphasis being given to the pattern matching aspects of dictionary based compression. The prior art has attempted to speed up the pattern matching including viewing the matching of substrings as a problem in dataflow analysis.

For purposes of this invention the term "character" is used synonomously with any standard unit of information in a codebook or the like such as "byte", "nibble", or "word".

STATISTICAL AND DICTIONARY COMPRESSION METHODS

Compression is the coding of data to minimize its representation. Lossless compression is a completely invertible function in which the original text or character string is obtained from the compressed string and vice versa. In this art, either statistical, dictionary, or mixed methods are used.

Statistical compression methods replace long data strings by shorter strings on a character basis. This compression process assumes that strings of characters are generated by Markov (stochastic) sources of identifiable order and that the sources can be accurately modeled and then encoded. A "Markov source" refers to a character string generator in which the symbol or character probabilities of occurrence and their conditional probabilities (sometimes termed intersymbol influence) can be computed or inferred from the source in some reliable and consistent manner. In this regard, a model is an approximation to the process of generating text. In statistical compression, a model is used to form the predictions of occurrence of characters in a text string. Text is compressed as a result of substitution of a code for an input character. Relatedly, the length of the code is determined as an inverse function of the estimated probability of occurrence of that character.

The dictionary methods achieve compression by replacing groups of consecutive characters (phrases) with indices into some dictionary. In this regard, a character is any member of an alphabet wherein an alphabet is the set of all possible characters that can occur in a text. Compression is achieved due to the fact that the dictionary comprises a list of tokens chosen so that on the average they take less space than the character strings (phrases) they encode.

Adaptive Dictionary Pointer Based Coding, Aspects of Ziv Lempel Codes, And Design Tradeoffs Adaptive coding refers to a class of compression methods where the dictionary (model used for coding) is based on text already encoded. This is also known as "dynamic coding". The principle of adaptive coding is to be found in the Ziv Lempel (LZ1977) adaptive dictionary coding.

In LZ1977 coding, phrases or subsequences of characters are coded as pointers to earlier occurrences in the text string. Decoding a text which has been compressed in this manner requires only that the decoder simply replace a pointer to the already decoded text to which the pointer makes reference.

To ascertain whether a current character has previously occurred in a string, it is necessary to either compare the current character with some portion of the characters in the recent past, or, look the characters up in a table. The longer the string of current characters that can be found to match a string in the recent past to which a single pointer can make reference, then the greater the compression. The number of comparisons increases as the lengths of the strings to be compared increases.

Adaptive dictionary compression represents a trade off between how far back a pointer can reach and which substrings within this limit may be the target of the pointer. The reach of the pointer may be an unrestricted growing window or a fixed size window. As a fixed size window, the pointer is restricted to a predetermined number of previous characters. The larger the window, then the larger is the number of comparisons and the greater the likelihood of finding a pattern match. However, as the window size increases, then encoding slows down and compression may worsen as the pointers become larger.

One advantage of a fixed sized window for storing recent past characters in a text string is that it limits pointer size. Also, encoding speed increases where the pattern match length is limited since the number of comparisons are limited.

The Jackson Patent

Jackson et. al., U.S. Pat. No. 4,054,951, issued Oct. 18, 1977 discloses the dictionary decompression of a data stream in which each occurrence of a previously occurring data string is appended as a <i,j,k,l> quartic to an output stream, i=flag or token, j=address in storage of the substring, k=length of the section, l=no. of repetitions. The compressed data is stored in a buffer driving beam control apparatus.

In principle, Jackson describes LZ1977 type dictionary compression with detailed differences in pointer encoding and field of use.

Ziv-Lempel 1977 And 1978 Codes

The LZ1977 dictionary compression code was described by Ziv and Lempel in "A Universal Algorithm For Sequential Data Compression", IEEE Trans. Information Theory, IT-24(3), pages 337–343, May, 1977. A second paper by Ziv et. al. "Compression Of Individual Sequences Via Variable Rate Coding", IEEE Trans. Information Theory, IT-24(5), pages 530–536, September, 1978, described a somewhat different dictionary compression method (LZ1978 code).

In the LZ1978 code, the recent past text string is parsed into phrases where each phrase is the longest matching phrase seen previously plus one character. Each phrase is then encoded as an index to its prefix+the extra character. The phrase is then added to the list of phrases that may be addressed for instance as a hashed address in memory. This is an alternative to LZ1977 compression coding where pointers are used to reference any string that appeared previously.

The Whiting Patent And The Back to Back Problem In Pattern Matching

Whiting et. al., U.S. Pat. No. 5,003,307, "Data Compression Apparatus With Shift Register Search Means", issued Mar. 26, 1991, discloses a modified LZ1977 compression coding method. In Whiting, each input character is in turn broadcast to each entry in a sliding window type of shift register containing recent past characters and simultaneously compared. A match or mismatch results in a 1 character position shift and the next input broadcast compared with all the register contents.

If a matching string is found within the shift register, then a triplet is appended to a compressed output string consisting of a tag, length of the pattern match, and a pointer to location in the shift register of the matching string. If a matching string is not found, then a raw data tag and the character are appended to the output string.

In one embodiment, Whiting limits the search to a predetermined number of input data characters at a time to achieve a fast encoding and assure compression for all matched patterns since the pointer will be short. This is based on the likelihood of two character pattern matches is higher than that of pattern matches of three or more characters.

One difficulty with Whiting's solution arises at the point in the pattern matching process when the pattern ends and a new one begins. That is, when the current pattern match (also termed a "prefix") cannot be extended further and the compression encoder must allow new pattern matches or prefixes to start at other locations, then extra checks and cycles are needed. This derives from the fact that when the input character sequence no longer continuously matches the stored history, then circuitry tracking the match length must be reset to enable tracking of a new pattern. This delay is termed the "Back-to-Back" problem.

Parsing And Finding The Longest Pattern Match
(Also Termed "Prefix Extension")

For purposes of this specification, a "greedy" algorithm is a strategy for optimization in which the local optimum is selected as the solution at each algorithm iteration or stage even though there is a reasonable expectation that it will differ from a global optimum. In greedy parsing, the encoder searches for the longest string in the history buffer, shift register or the like which matches the next string of one or more input characters. Encoding occurs at the point in the pattern comparison when the first mismatch is detected.

The following example illustrates greedy parsing as found in the LZ1977 compression method:

Assume that the method uses a "sliding window" of N characters in a left shifting register. Of these, the first N-F characters have been encoded and the last F characters constitute a "lookahead buffer".

Illustratively—if the string "abcabcbacbababcab . . . " is being LZ1977 encoded under the parameters of N=11 and F=4, then the character at position 12 is to be next encoded:

TABLE 1

| 5 | 6 | 7 | 8 | 9 | 10 | 11 | 12 | 13 | 14 | 15 |
|---|---|---|---|---|----|----|----|----|----|----|
| b | c | b | a | c | b  | a  | b  | a  | b  | c  |
| | ←── already encoded ──→ | | | | | | | ← lookahead buffer → | | |

(a) To encode the next character, the first N-F characters of the window shown in TABLE 1 are searched to find the longest match with the lookahead buffer. The match may overlap the buffer but cannot be the buffer itself.

(b) The longest match is then coded into a triple <i,j,a>, where "i" is the offset of the longest match from the lookahead buffer, "j" is the length of the match, and "a" the first character that did not match the substring in the window.

(c) The window is then shifted right j+1 positions or characters ready for another coding step. Attaching an explicit first nonmatch character to each pointer ensures that encoding can proceed even if there is no match for the first character in the lookahead buffer.

In this example, the longest match in the "history buffer" for the "lookahead" buffer contents "babc" is "bab". This starts on string position 10. The triple <i,j,a> would be <2,3,c> in which the offset is the 2 units removed from the lookahead buffer (match starts at position 10). The length of the match covers 3 characters (overlap is OK) and the first non-match character in the lookahead buffer is "c".

Data Flow Models and Parallelism To Enhance
Pattern Matching

It is known that a concurrent data flow model of a computation (i.e. pattern matching) involves the notion that data rather than control drives the action. A data flow model is one which maps successive transformations of values on the arrival or availability of the data. Thus, the order of execution is dictated by data availability including the fact that concurrent availability results in concurrent execution. Thus, a computation may be projected onto a directed acyclic graph (termed data dependency graphs) to identify concurrently available data elements.

It is also known in the prior art that a concurrent data flow model regulated by a finite state machine may be applied to an LZ1977 dictionary encoder. This permits a content addressable memory (CAM) to be used as a sliding window for storage of previously processed input string characters. When combined with several registers and state controlled logic, the CAM facilitates comparison matching of an input character with all of the characters in the sliding window in parallel. Such comparison is indicative either of a prefix extension or termination of a matching strings of characters. The disadvantage resides in the limited number of characters that can be matched per encoding cycle and the delay inherent in resetting the system when one pattern terminates and another pattern match begins. The latter is referred to as the "Back-to-Back" problem.

SUMMARY OF THE INVENTION

It is an object of this invention to devise a method and means for increasing the number of characters per cycle in ascertaining a maximal length pattern match between a string of new characters and characters in the string processed in the recent past.

It is a related object that such method and means be operable under recursive forward or backward exhaustive greedy searching or matching.

It is yet another related object that such method and means use parallel combinatorial operators and pipeline processing of the pattern match without any pipeline stall.

It is a related object that such method and means be used as one phase of a continuous multi-phase dictionary compression and decompression method and means of the Ziv-Lempel (LZ1977) type.

The original LZ1977 coding paradigm involves:

(1) finding the longest matching of two substrings using a matching algorithm. The algorithm is operable where one of the other substrings has a prefix in the history buffer, and where the other of the substrings has a prefix extension as the next character in the partial ordered string in the look-ahead buffer; and (2) encoding the longest matching sub-string with fewer bits such as a relative address in a recent past portion of the string in the history buffer or the like.

In contrast, the paradigm of this invention comprises (a) parsing a multiple of the longest substrings and encoding those if necessary; (b) continuing or terminating a previous string prefix; and (c) determining a new prefix for the next cycle.

In this invention, characters of a first character string stored in a sliding window history buffer are pattern matched to N characters of a second character string stored in an look-ahead buffer during a single coding cycle. However, a K character pattern match is accomplished during any one coding cycle by:

(a) recursively executing an backward or forward exhaustive greedy comparison match on substrings of characters between said second and first strings, the recursion including any prefix extensions from the first to second strings and any substrings within the first string; and (b) denoting the locations of any ascertained maximal substring pattern matches in the look-ahead and history buffers, and, transferring the N characters from the look-ahead buffer to the history buffer.

The recursive backward or forward exhaustive greedy pattern matching involves two related sets of constraints. These are denoted as Part 1 and Part 2. In Part 2, the forward matching constraints include a slight variance over the backward matching constraints.

The Part 1 constraint states that if a backward or forward greedy comparison match results in a match length L=K+1, then update a prefix register with the K+1 extension. If the match length L<K+1 and if the longest match L=1, then update the prefix register with the longest match found, assign a tracking variable J=(K−L), and continue processing the backward or forward greedy pattern match according to Part 2.

The Part 2 constraint requires as a condition precedent either that Part 1 was partially processed or that J>0 for the backward case or that J<K for the forward case. Part 2 involves the execution of a backward or forward greedy recursion to identify the longest pattern matching length L' between the first and second strings. If L'=J+1, then the pattern matching terminates. Otherwise, the tracking variable J' will be set equal to J−L>0 and the pattern match will recur on Part 2.

The backward and forward exhaustive greedy pattern matching steps are NOT commutative except where the ordering of the character string subject is symmetric. Thus, "a,a,a,a,a,a, . . . a" or "able was i ere i saw elba" would produce the same match results. However, there is no evidence showing a significant compression difference between the forward or backward recursions.

Significantly, recursions constrained according to Part 1 result in string prefixes for the next coding cycle while recursions governed by Part 2 will generate all interim match terminations of substrings of various lengths.

The delay occasioned by prior art methods where one pattern match ends and another begins (Back-to-Back) is avoided in a variant of the inventive method and means. This variant generates continuous match termination status indication marked in a pair of shift registers and expressed via suitable AND/OR logic.

Illustratively, the variant for one character per encoding cycle also (a) recursively executes a backward or forward exhaustive greedy comparison match on substrings of an N character string $a=a_1, a_2, \ldots a_i$ stored in a look-ahead buffer and characters in a string $b=b_1,b_2, \ldots$ stored in a sliding window history buffer including any prefix extensions. It differs by (b) processing each character $a_{i+1}$ in the lookahead buffer utilizing several substeps concurrently. These concurrent substeps consist of:

(1) writing a Boolean value $m_{i+1}$ into a first shift register, $m_{i+1}$ being a match with $a_{i+1}$ in counterpart positions in the sliding window history buffer;

(2) writing a Boolean value $m_i$ from each stage of the first shift register into a counterpart stage of a second shift register offset by a predetermined number of stages, $m_i$ being a match with $a_i$ in counterpart positions in the history buffer written to the first register; and (3) forming a Boolean valued signal (match lookahead or MLA) as a disjunction of ($m_i$ AND $m_{i+1}$) summed over each pair of stages of the first and second registers such that a Boolean value of a first kind is indicative of pattern match continuation and a Boolean value of a second kind is indicative of pattern match termination.

This variant can be extended for two or more characters at a time matching per encoding cycle using forward or backward searching subject to the Part 1 and Part 2 constraints.

BRIEF DESCRIPTION OF THE DRAWING

FIGS. 4A–4C depict another maximal length pattern matching logic arrangement effectuating two characters per cycle of LZ1977 compression encoding.

FIGS. 5A and 5B show the flow of control and selected register states included in forming the match lookahead (MLA) signals in the two character per cycle pattern matching embodiment.

FIG. 6 illustrates a flow of control and selected register states in forming match lookahead signals from a forward exhaustive greedy pattern match extended to process three characters per cycle of LZ1977 compression encoding.

DESCRIPTION OF THE PREFERRED EMBODIMENT

Figure 1A:
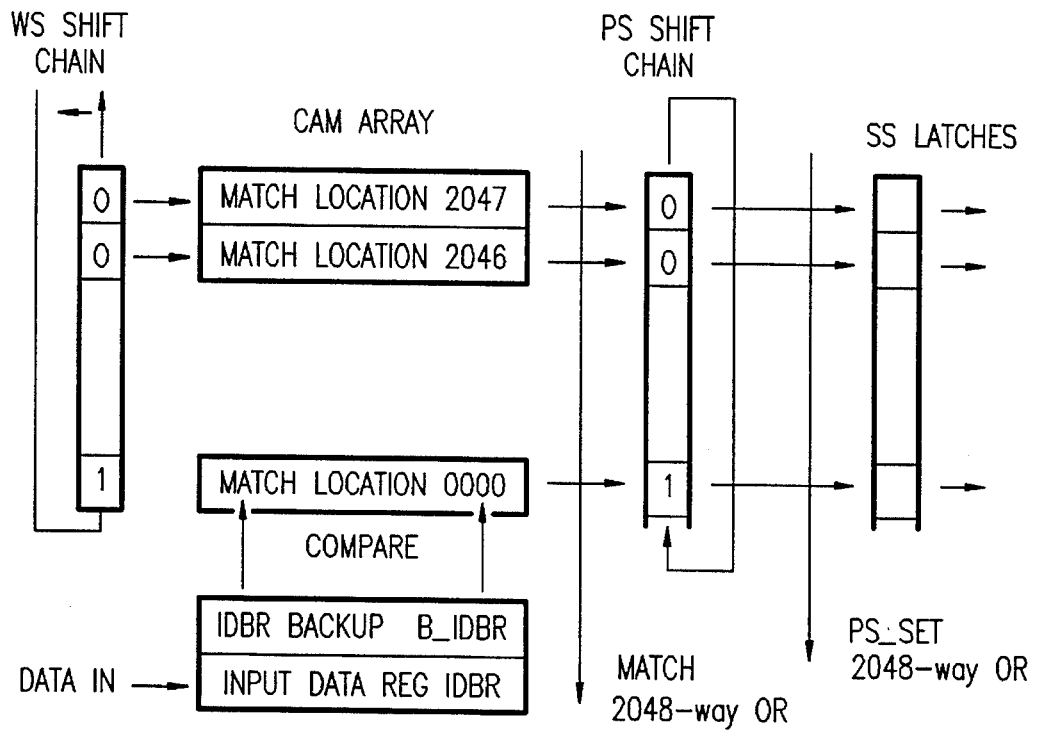
FIG. 1 exhibits the pattern matching logic of a content addressable memory (CAM) type LZ 1977 compression encoder and main processing loop according to the prior art.

Referring now to FIG. 1, there is shown pattern matching logic of a content addressable memory (CAM) type LZ 1977 compression encoder and main processing loop according to the prior art. The pattern matching logic comprises a CAM array operable as a sliding window history buffer for storing recent past characters in a character string, a write select (WS) shift chain for entering an input character in shift position in the CAM, and an asynchronously set and rotatable shift chain and register (PS) as reset by a corresponding match output and various counters and buffers.

Referring to the logic and the pseudo-code flow of control shown in FIG. 1, it is the case that at the start of a match operation, the first reentrant shift register (PS) is fed with a Boolean value of the first kind (a logical 1) to mark in the CAM every place where a possible string match occurs. A state indicator (The PS_SET signal) is set to a logical 1. This indicator is maintained as long as at least one logical 1 in the first register (PS) is set. As subsequent bytes are processed, a match no longer sets new markers (logical 1's) into the first register PS. Instead, a mismatch causes the corresponding first register (PS) marker bits to be reset (destroyed). This causes the state indicator (PS_SET) to be reset to a logical 0 from a logical 1. This means that the string pattern match is terminated. At the same time, the ends (end) of matching strings (string) are marked by logical 1's in a second shift register (SS).

If the match length was two or greater, a compressed token will be generated. The compressed token is consists of a prefix "1", an offset address, and a pointer length code. The offset is computed as a modulo subtraction of the address of one of the last active first register (PS) markers, as saved in the second register (SS), minus the string length, less one.

Referring again to FIG. 1 especially the pseudocode statements 5–7. Statements 5–7 denominate the critical Back-to-Back match operations. This requires that the first register (PS) be asynchronously reset by the corresponding match. Since the state indicator (PS_SET) is a 0, then all of the first registers (PS) are 0. The first registers must now be reloaded as new matches could start at different locations in the CAM. This means that the first registers (PS) will need to shift (rotate) before the next encoding cycle. Such reloading and shifting constitute the delay in the Back-to-Back matching.

Pattern Matching Logic According to the Invention

Figure 2A:
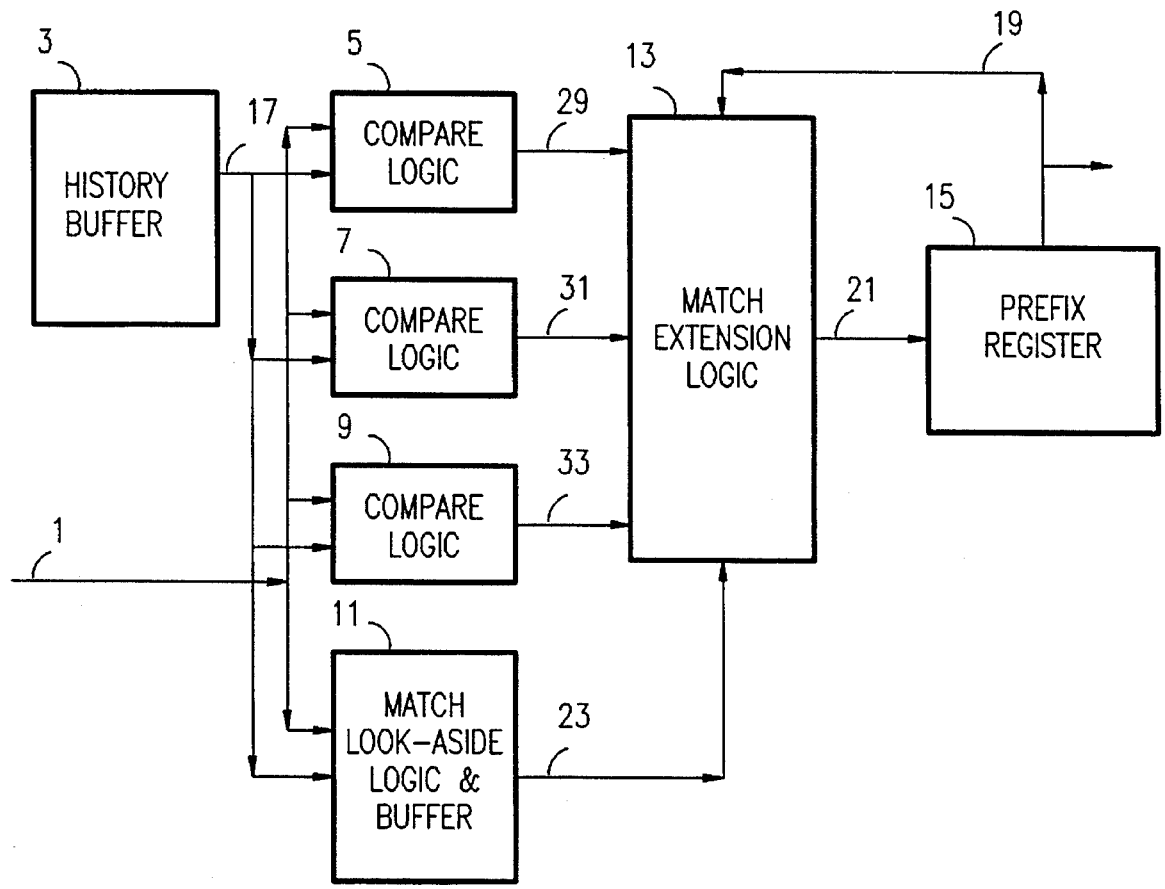
FIG. 2A depicts a general logic arrangement according to the invention for a maximal length pattern matching network including match look-aside logic for carrying out a multiple character per cycle LZ1977 compression encoding.

Referring now to FIG. 2A, there is shown a logic arrangement for pattern matching according to the method and means of the invention. In this arrangement, each character from the lookahead buffer (not shown) is applied on path 1 in parallel as one input to a set of comparison logic gates 5, 7, and 9 and to a match look-aside logic and buffer unit 11. The sliding window history buffer 3 provides a character output from each of its counterpart stages to the compare logic gates and to a match look-aside logic and buffer 11 over paths 17.

The output of the compare logic gates identifies the match positions within the history buffer. These match indications are applied to locations within the match extension logic 13 over paths 29, 31, 33 as controlled by the state of the look-aside logic 11 applied to logic 13 over path 23. The state of the match extension logic provides pattern match string termination information. It further controls the storage in prefix register 15 of the prefix being extended. Likewise, logic 13 controls the transfer of one or more match strings elsewhere at termination over a path 19.

A Dataflow Characterization Of The Pattern Matching Logic

The prior art described with respect to FIG. 1 requires a finite state machine to control several minor cycles for each character that was encoded or compressed. In contrast, in the method and means of this invention, the variable minor cycles of the concurrent data flow (CDF) are transformed into a fixed cycle pipeline concurrent data flow (PCDF). As will be subsequently explained in connection with specific logic embodiments and control/data flow, PCDF offers several advantages over CDF including preservation of compression effectiveness, no system overhead, and presents only moderate complexity.

Figure 2B:
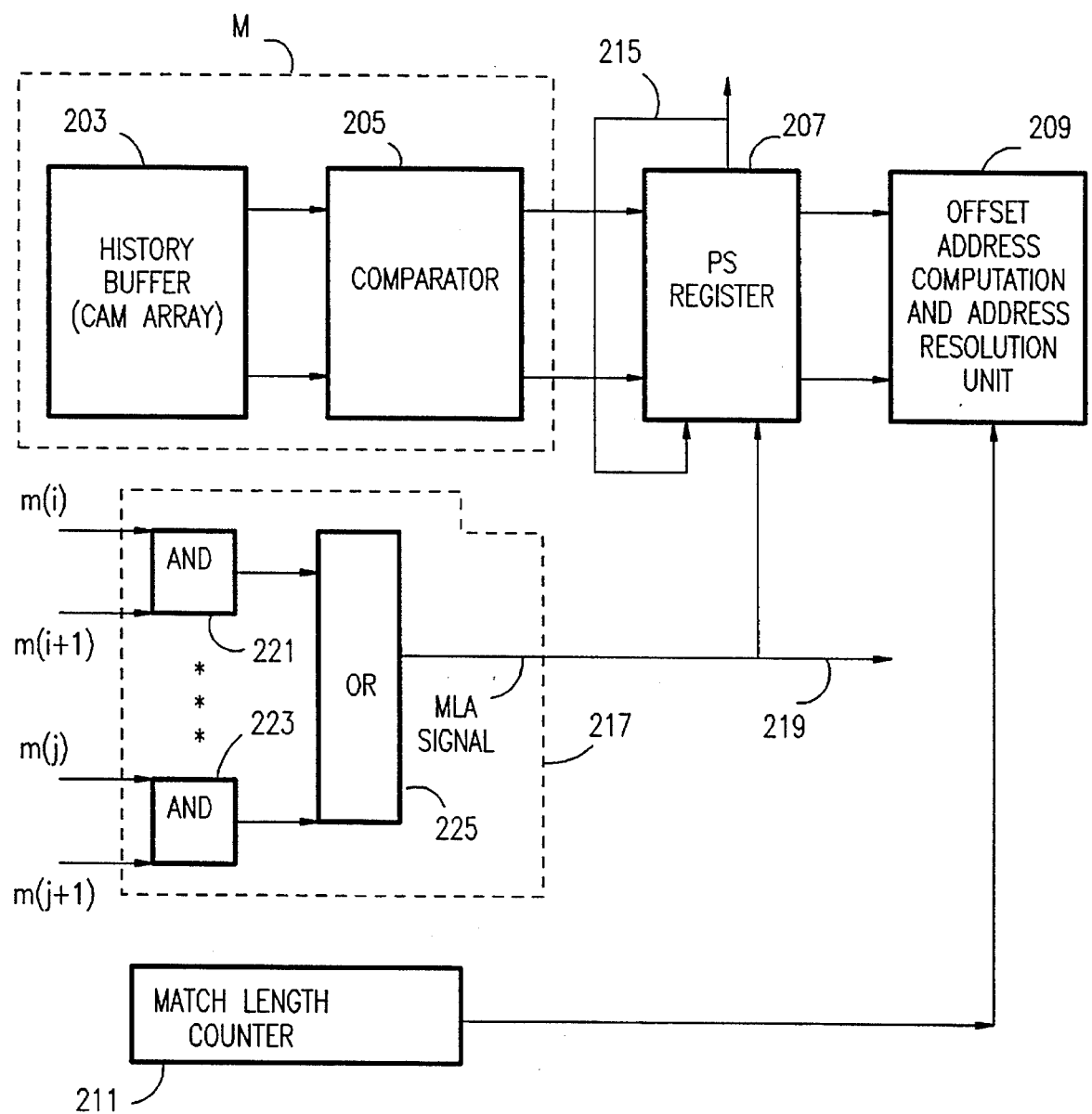
FIG. 2B shows the arrangement depicted in FIG. 2A as a pipelined concurrent dataflow (PCDF) high level pattern matching logic for LZ1977 compression.

Referring now to FIG. 2B, there is shown the arrangement depicted in FIG. 2A expressed as a pipelined concurrent dataflow (PCDF) high level pattern matching logic for LZ1977 compression.

The PCDF can also be functionally partitioned into (1) a history buffer 203 and a comparator 205 which form a match register (M) identifying the locations in the history buffer of an input character, (2) a Primary Select (PS) register 207 having a re-entrant path 215 responsive to M, (3) a match lookahead (MLA) unit 217 responsive to signals from M and the PS register 207, (4) a match length counter 211, and (5) an offset address computation unit 209 responsive to the counter 211 and an MLA signal on path 219 from the MLA unit 217.

The PS register 207 is a shift-and-parallel-load, register executing conditionally:

IF MLA=0, THEN parallel load M to PS, ELSE shift and rotate PS contents, the shifted input is gated by ML, The Match Look Ahead unit 217 provides flow decisions including parallel-load or circular-shifting to PS register 207. It reduces the need of the PS to perform two or three operations to one. Three operations being required in the CDF configuration. The MLA flow decisions avoid any gap of pipelined flow even in the back-to-back match case. The MLA includes a many way input OR gate 225. Each OR input is a two-way AND gate such as 221 and 223 of a match at i position in the history buffer 203 and an input character Anded with its PS register output.

The Offset Address Computation Unit 209 resolves the address of one of the last remaining markers in PS register 207. The matched length less 1 (L–1) is then subtracted from the address to obtained the starting match position, also called offset address. Lastly, an Edge Detection circuit (not shown) derives the end of string match from MLA signal 219.

Pattern Matching Using The New Paradigm And Illustrative Examples

The paradigm subsumes a shift register partitioned into a sliding window history buffer and a fixed length K lookahead buffer. The method and means (1) parse the character string into one or a multiple of longest substrings to find the multiple longest substrings, if necessary; (2) continue or terminate the previous string prefix; and (3) determine the new prefix for the next encoding cycle.

In the following three examples of maximal pattern matching assume a K=5 character lookahead buffer and a backward exhaustive greedy pattern matching algorithm:

Example 1

TABLE 2

| HISTORY BUFFER | | | | | | LOOKAHEAD BUFFER K = 5 | | | | MATCH LENGTH | MAX-IMAL |
|---|---|---|---|---|---|---|---|---|---|---|---|
| z | x | x | x | x | x | a | b | a | b | ← 2 | X |

TABLE 2-continued

| HISTORY BUFFER | | | | | LOOKAHEAD BUFFER K = 5 | | | | | MATCH LENGTH | MAX-IMAL |
|---|---|---|---|---|---|---|---|---|---|---|---|
| z | x | x | x | x | x | a | b | a | b | | |
| | | | | | ← | | | | | 3 | — |
| | | | | ← | | | | | | 4 | — |
| | | | ← | | | | | | | 5 | — |
| | | | ← | | | | | | | 6 | — |

Table 2 illustrates a backward greedy search for prefix-extension (match length) according to the invention Part 1 constraints.

The Part 1 constraint states that:
(a) if a backward or forward greedy comparison match results in a match length L=K+1, then update a prefix register with the K+1 extension.
(b) If the match length L<K+1 and if the longest match L=1, then update the prefix register with the longest match found, assign a tracking variable J=(K−L), and continue processing the backward or forward greedy pattern match according to Part 2.

Applying the constraints to Table 2, the longest substring in search backwards is "ab". Since L=2, then L<K+1 The locations in the lookahead or history buffers that matched with "ab" will be stored in the prefix register 15 in FIG. 2. Since J=K−L=5−2=3>0, then the backward recursion continues according to the Part 2 constraints.

TABLE 3

| HISTORY BUFFER | | | | | LOOKAHEAD BUFFER K = 5 | | | | | MATCH LENGTH | MAX-IMAL |
|---|---|---|---|---|---|---|---|---|---|---|---|
| z | x | x | x | x | x | a | b | a | b | | |
| | | | | | ← | | | | | 2 | — |
| | | | | ← | | | | | | 3 | — |
| | | | ← | | | | | | | 4 | — |
| | | | ← | | | | | | | 5 | — |

Table 3 depicts a backward greedy search for prefix-extension (match length) according to the invention Part 2 constraints.

The Part 2 constraint requires as a condition precedent either that Part 1 was partially processed or that J>0 for the backward case or that J<K for the forward case. Part 2 involves the execution of a backward or forward greedy recursion to identify the longest pattern matching length L' between the first and second strings. If L'=J+1, then the pattern matching terminates. Otherwise, the tracking variable J' will be set equal to J−L>0 and the pattern match will recur on Part 2.

As may be recalled, a tracking variable J=K−L=5−2=3. In table 3, the backward recursion starts at a point shifted L=2 characters to the left in the lookahead buffer. Thus K=3 for this event. In this recursion, the longest substring in the backward search is "b". This means that L=1 and J=K−L=3−1=2. Since J>0, another recursion under Part constraints will be invoked.

TABLE 4

| HISTORY BUFFER | | | | | LOOKAHEAD BUFFER K = 5 | | | | | MATCH LENGTH | MAX-IMAL |
|---|---|---|---|---|---|---|---|---|---|---|---|
| z | x | x | x | x | x | a | b | a | b | | |
| | | | | ← | | | | | | 2 | |
| | | | ← | | | | | | | 3 | |

In table 4, the recursion starts from a point shifted by one position to the left of the last position i.e. K=2. The longest substring in searching backward is "a". Since L=1, then J=K−L=2−1=1. This means that per Part 2 constraints, J>0. Thus, there is a another recursion under these constraints.

TABLE 5

| HISTORY BUFFER | | | | | LOOKAHEAD BUFFER K = 5 | | | | | MATCH LENGTH | MAX-IMAL |
|---|---|---|---|---|---|---|---|---|---|---|---|
| z | x | x | x | x | x | a | b | a | b | | |
| | | | | ← | | | | | | 2 | |

The recursion starts from 1 position shifted to the left of the last position or K=1. The substring identified during this recursion is "x". This substring is an extension of the previous string prefix "xxx". Since J=K−L=1−1=0. No further recurrence under the Part 2 constraints is needed.

The substrings determined according to the backward exhaustive greedy pattern matching algorithm are "ab", "b", "a", "x". In this regard, "ab" is a string prefix extension for the next encoder cycle so that it is not released to the encoder. However, substrings "b" and "a" can be released to the encoder while "x" as an extension of "xxxx" will subsequently be released.

It should be recalled that recursions constrained according to Part 1 result in string prefixes before the next coding cycle while recursions governed by Part 2 will generate all interim match terminations of substrings of various lengths.

EXAMPLE 2

TABLE 6

| HISTORY BUFFER | | | | | LOOKAHEAD BUFFER K = 5 | | | | | MATCH LENGTH | MAX-IMAL |
|---|---|---|---|---|---|---|---|---|---|---|---|
| z | x | x | x | x | a | a | a | a | a | | |
| | | | | | ← | | | | | 2 | — |
| | | | | ← | | | | | | 3 | — |
| | | | ← | | | | | | | 4 | — |
| | | ← | | | | | | | | 5 | X |

TABLE 6-continued

| HISTORY BUFFER | LOOKAHEAD BUFFER K = 5 | | | | | | | | MATCH | MAX- |
|---|---|---|---|---|---|---|---|---|---|---|
| z | x | x | x | x | a | a | a | a | LENGTH | IMAL |
| | ⟵─────────── | | | | | | | | 6 | — |

In this example, the lookahead buffer in table 6 is replete with a K−1 character match. More particularly, in executing a backward greedy match recursion, the longest substring is "aaaa". The locations that match with "aaaa" will be stored in the prefix register 15 in FIG. 2A. Since L=4, then J=K−L=5−4=1 per the Part 1 constraints and the recursion will continue according to the Part 2 constraints in view of the fact that J>0.

TABLE 7

| HISTORY BUFFER | LOOKAHEAD BUFFER K = 5 | | | | | | | | MATCH | MAX- |
|---|---|---|---|---|---|---|---|---|---|---|
| z | x | x | x | x | a | a | a | a | LENGTH | IMAL |
| | ⟵─── | | | | | | | | 2 | — |

According to table 7, the recursion starts at 4 places to the left. Thus, K=1. The longest substring in searching backward is "a". It follows that J=K−L=1−1=0. Since J=0, the recursion terminates, Part 2 ends, and the prefix "xxx" in the history buffer cannot be extended.

The substrings matched according to the backward greedy algorithm are "aaaa", "a", and "xxx". Of these, the substring "aaaa" is a prefix extension for the next coding cycle and will not be released to the coder. In contrast, substrings "a" and "xxx" will be released to the coder.

EXAMPLE 3

TABLE 8

| HISTORY BUFFER | LOOKAHEAD BUFFER K = 5 | | | | | | | | MATCH | MAX- |
|---|---|---|---|---|---|---|---|---|---|---|
| z | a | a | a | a | a | a | a | a | LENGTH | IMAL |
| | ⟵─────── | | | | | | | | 2 | — |
| | ⟵─────────── | | | | | | | | 3 | — |
| | ⟵─────────────── | | | | | | | | 4 | — |
| | ⟵─────────────────── | | | | | | | | 5 | — |
| | ⟵─────────────────────── | | | | | | | | 6 | — |
| | ⟵─────────────────────────── | | | | | | | | 7 | — |
| | ⟵─────────────────────────────── | | | | | | | | 8 | X |

In table 8, a recursive backward greedy pattern match elicits the match "aaaaaaaa" or L=8 as the maximal length substring. According to the Part 1 constraints if J=K−L≦0, then the longest substring is processed as an extension of the prior string prefix "aaa". That is at the end of the recursion, the string prefix is extended to "aaa aaaaa".

One Character Per Encoding Cycle Pattern Matching Logic

Figure 3:
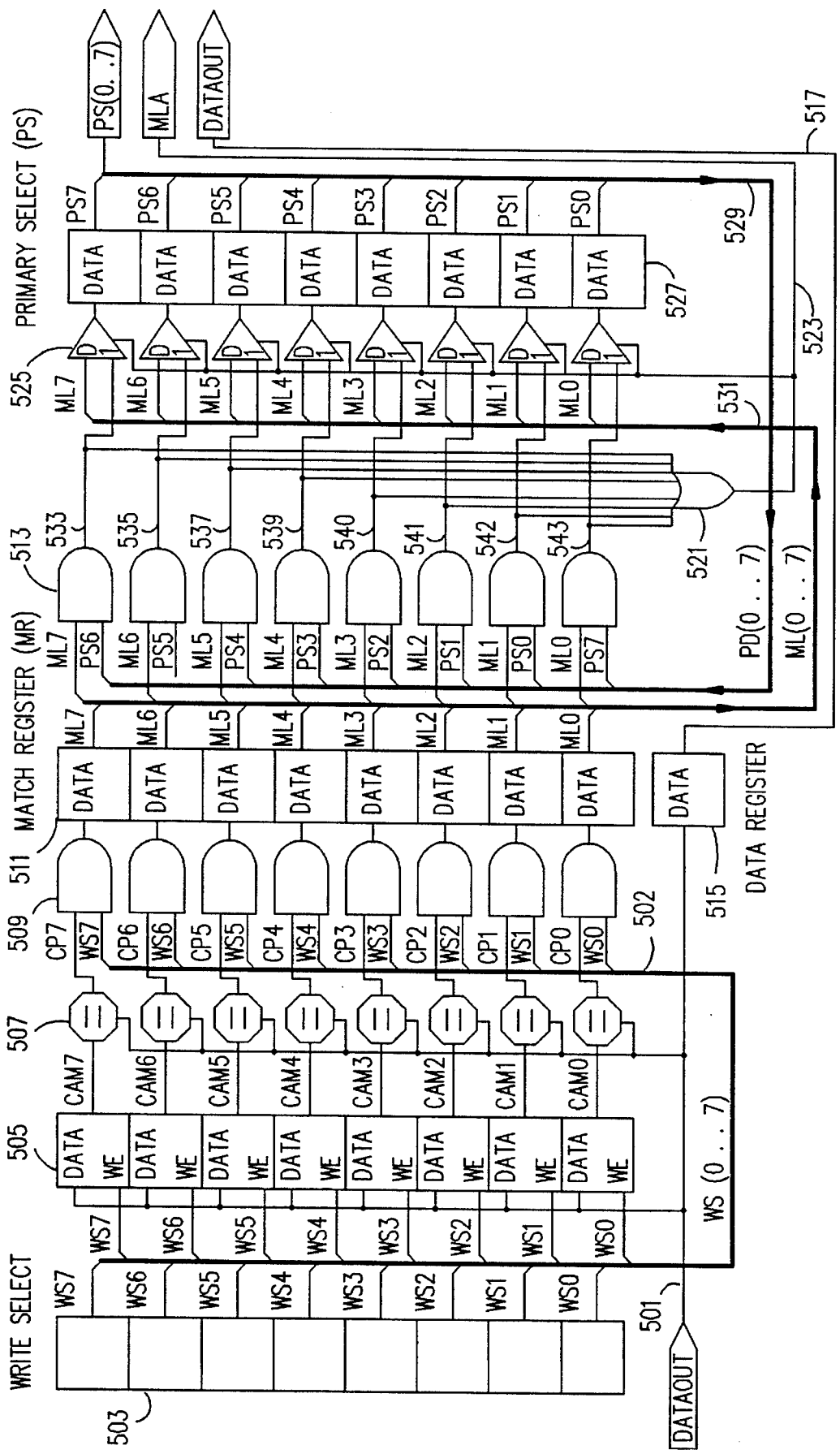
FIG. 3 sets out a maximal length pattern matching logic arrangement according to the invention for effectuating one character per cycle of LZ1977 compression encoding.

Referring now to FIG. 3, there is shown a maximal length pattern matching logic arrangement according to the invention for effectuating one character per cycle of LZ1977 compression encoding. This configuration includes a write select (WS) register 503 gating input character access to the history buffer 505 and AND gates 509. WS contains a single "0", with all the rest of the bits being "1's ". This single "0" denotes the current position within the history buffer 505 into which a character is being written. After each cycle, the WS register is rotated by one position. The combination of the WS register 503 and the buffer 505 gives effect to the sliding window. That is, the history buffer retains only a fixed number of consecutively processed characters from the recent past portion of an input character string. For each new character written into the buffer, the oldest character is eliminated from the buffer.

At the time a new input character is being written into buffer 505 location designated by WS register "0" position, the input character is also being compared with the current characters stored in every location of the buffer. It should be noted that each stage in the buffer has an output driving a counterpart one of the comparison circuits 507. The input character into the comparison circuits is provided over path 501. The AND gates 509 coupling counterpart comparison circuits 507 gate out the position in the buffer 505 that is being written to. This forces the compare to that location to be "0". The matching condition is then stored in the match register 511.

The match register 511 drives the match lookahead circuitry formed by AND gates 513 and OR gate 521. The AND gates 513 also drive a loading path (paths 531, 533–545, gates 525) to counterpart locations into the primary select (PS) register 527. The PS register 527 is either loaded with the contents of MR register 511, if the MLA signal is "0" or the match lookahead condition if the MLA signal is a "1".

An Illustrative Example Of One Character Per Cycle Pattern Matching According To The FIG. 3 Embodiment Of The Invention Referring again to FIG. 3, the pattern matching portion of the encoder includes a 32-character entry CAM (503, 505, 507, 509) a corresponding 32-bit MR (Match Register 511) and a 32-bit PS (Primary Select Register 527). Now, the CAM is labeled from left to right, with position 0 at the left most position; position 0 is the first position being written to, then 1, 2, . . . , 31, 0, 1, . . . etc. Let the input stream be the following:

"abcdefgabcdewxyzabcdxyzabcda . . . "

After the first cycle, the following register conditions pertain:

| CAM: | a | | | | | | | | | | | | | | | | | | |
|---|---|---|---|---|---|---|---|---|---|---|---|---|---|---|---|---|---|---|---|
| MR: | 0 | 0 | 0 | 0 | 0 | 0 | 0 | 0 | 0 | 0 | 0 | 0 | 0 | 0 | 0 | 0 | 0 | 0 | 0 |
| PS: | 0 | 0 | 0 | 0 | 0 | 0 | 0 | 0 | 0 | 0 | 0 | 0 | 0 | 0 | 0 | 0 | 0 | 0 | 0 |

| | CAM: | | | | | | | | | | | | | |
|---|---|---|---|---|---|---|---|---|---|---|---|---|---|---|
| | MR: | 0 | 0 | 0 | 0 | 0 | 0 | 0 | 0 | 0 | 0 | 0 | 0 | 0 | Data: a |
| | PS: | 0 | 0 | 0 | 0 | 0 | 0 | 0 | 0 | 0 | 0 | 0 | 0 | 0 | Data: _ |

After cycle 2, the following register conditions pertain:

| CAM: | a | b | | | | | | | | | | | | | | | | | | |
|---|---|---|---|---|---|---|---|---|---|---|---|---|---|---|---|---|---|---|---|---|
| MR: | 0 | 0 | 0 | 0 | 0 | 0 | 0 | 0 | 0 | 0 | 0 | 0 | 0 | 0 | 0 | 0 | 0 | 0 | 0 | |
| PS: | 0 | 0 | 0 | 0 | 0 | 0 | 0 | 0 | 0 | 0 | 0 | 0 | 0 | 0 | 0 | 0 | 0 | 0 | 0 | |

| | CAM: | | | | | | | | | | | | | |
|---|---|---|---|---|---|---|---|---|---|---|---|---|---|---|
| | MR: | 0 | 0 | 0 | 0 | 0 | 0 | 0 | 0 | 0 | 0 | 0 | 0 | 0 | Data: b |
| | PS: | 0 | 0 | 0 | 0 | 0 | 0 | 0 | 0 | 0 | 0 | 0 | 0 | 0 | Data: a |

Since there are no consecutive '1's in the MR and PS, the first "a" is sent to the coding unit, where it is coded as a raw byte.

After cycle 3, the following register conditions pertain:

| CAM: | a | b | c | | | | | | | | | | | | | | | | | |
|---|---|---|---|---|---|---|---|---|---|---|---|---|---|---|---|---|---|---|---|---|
| MR: | 0 | 0 | 0 | 0 | 0 | 0 | 0 | 0 | 0 | 0 | 0 | 0 | 0 | 0 | 0 | 0 | 0 | 0 | 0 | |
| PS: | 0 | 0 | 0 | 0 | 0 | 0 | 0 | 0 | 0 | 0 | 0 | 0 | 0 | 0 | 0 | 0 | 0 | 0 | 0 | |

| | CAM: | | | | | | | | | | | | | |
|---|---|---|---|---|---|---|---|---|---|---|---|---|---|---|
| | MR: | 0 | 0 | 0 | 0 | 0 | 0 | 0 | 0 | 0 | 0 | 0 | 0 | 0 | Data: c |
| | PS: | 0 | 0 | 0 | 0 | 0 | 0 | 0 | 0 | 0 | 0 | 0 | 0 | 0 | Data: b |

Again, the first 'b' is sent to the coding unit, where it is coded as a raw byte. This process continues until after cycle 7, at which point the following register conditions pertain the following:

| CAM: | a | b | c | d | e | f | g | | | | | | | | | | | | | |
|---|---|---|---|---|---|---|---|---|---|---|---|---|---|---|---|---|---|---|---|---|
| MR: | 0 | 0 | 0 | 0 | 0 | 0 | 0 | 0 | 0 | 0 | 0 | 0 | 0 | 0 | 0 | 0 | 0 | 0 | 0 | |
| PS: | 0 | 0 | 0 | 0 | 0 | 0 | 0 | 0 | 0 | 0 | 0 | 0 | 0 | 0 | 0 | 0 | 0 | 0 | 0 | |

| | CAM: | | | | | | | | | | | | | |
|---|---|---|---|---|---|---|---|---|---|---|---|---|---|---|
| | MR: | 0 | 0 | 0 | 0 | 0 | 0 | 0 | 0 | 0 | 0 | 0 | 0 | 0 | Data: g |
| | PS: | 0 | 0 | 0 | 0 | 0 | 0 | 0 | 0 | 0 | 0 | 0 | 0 | 0 | Data: f |

After the cycle 8, the following register conditions pertain:

| CAM: | a | b | c | d | e | f | g | a | _ | _ | _ | _ | _ | _ | _ | _ | _ | _ | _ |
|---|---|---|---|---|---|---|---|---|---|---|---|---|---|---|---|---|---|---|---|
| MR: | 1 | 0 | 0 | 0 | 0 | 0 | 0 | 0 | 0 | 0 | 0 | 0 | 0 | 0 | 0 | 0 | 0 | 0 | 0 |
| PS: | 0 | 0 | 0 | 0 | 0 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | |
|---|---|---|---|---|---|---|---|---|---|---|---|---|---|---|
| | MR: | 0 | 0 | 0 | 0 | 0 | 0 | 0 | 0 | 0 | 0 | 0 | 0 | Data: a |
| | PS: | 0 | 0 | 0 | 0 | 0 | 0 | 0 | 0 | 0 | 0 | 0 | 0 | Data: g |

The MR now contains the location where the second 'a' matched with the first 'a' already in the CAM. The 'g' byte will be sent to the coding unit and it will be coded as a raw byte. After cycle 9, the following register conditions pertain:

| CAM: | a | b | c | d | e | f | g | a | b | _ | _ | _ | _ | _ | _ | _ | _ | _ | _ |
|---|---|---|---|---|---|---|---|---|---|---|---|---|---|---|---|---|---|---|---|
| MR: | 0 | 1 | 0 | 0 | 0 | 0 | 0 | 0 | 0 | 0 | 0 | 0 | 0 | 0 | 0 | 0 | 0 | 0 | 0 |
| PS: | 1 | 0 | 0 | 0 | 0 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | |
|---|---|---|---|---|---|---|---|---|---|---|---|---|---|---|
| | MR: | 0 | 0 | 0 | 0 | 0 | 0 | 0 | 0 | 0 | 0 | 0 | 0 | Data: b |
| | PS: | 0 | 0 | 0 | 0 | 0 | 0 | 0 | 0 | 0 | 0 | 0 | 0 | Data: a |

Now MR contains a '1' in position 1, while PS contains a '1' in position 0. Since these positions are offset by 1, it must be the case that a matching string has been found.

To determine whether a match continues or terminates, it is necessary to first AND MR(i) with PS(i−1) (Match_Load(O)=MR(O) AND PS(31), Match_Load(1)=MR(1) AND PS(0), Match_Load (2)=MR(2) AND PS(1), . . . , Match_Load(31)=MR(31) AND PS(30)), and then take the OR of these.

The output of the OR gate is called the MLA (Match Look-Ahead):

MLA=Match_Load(O) OR Match_Load(1) OR . . . OR Match_Load(31).

If MLA is '1', then the string match continues. In this case, the Match_Load bits are loaded into the PS.

On the other hand, if MLA is '0', then the match has terminated, and PS should be loaded with the contents of MR to start the string matching process over in the next cycle. In the above example, MLA is '1', so the PS is loaded with Match Load. At the same time, the contents of the CAM are compared with the next input byte.

Finally, it is necessary to track the length of the match. To do this, a match length counter is initially set to 1. This counter is incremented by 1 every time MLA is 1, and reset to 1 every time MLA is 0. After cycle 10, the following register conditions pertain:

| CAM: | a | b | c | d | e | f | g | a | b | c | _ | _ | _ | _ | _ | _ | _ | _ | _ |
|---|---|---|---|---|---|---|---|---|---|---|---|---|---|---|---|---|---|---|---|
| MR: | 0 | 0 | 1 | 0 | 0 | 0 | 0 | 0 | 0 | 0 | 0 | 0 | 0 | 0 | 0 | 0 | 0 | 0 | 0 |
| PS: | 0 | 1 | 0 | 0 | 0 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | |
|---|---|---|---|---|---|---|---|---|---|---|---|---|---|---|
| | MR: | 0 | 0 | 0 | 0 | 0 | 0 | 0 | 0 | 0 | 0 | 0 | 0 | Data: c |
| | PS: | 0 | 0 | 0 | 0 | 0 | 0 | 0 | 0 | 0 | 0 | 0 | 0 | Data: b |

Again MLA is 1, the match length counter is incremented by 1, and PS is loaded with the Match_Load bits. After cycle 11, the following register conditions pertain:

| CAM: | a | b | c | d | e | f | g | a | b | c | d | _ | _ | _ | _ | _ | _ | _ | _ |
|------|---|---|---|---|---|---|---|---|---|---|---|---|---|---|---|---|---|---|---|
| MR:  | 0 | 0 | 0 | 1 | 0 | 0 | 0 | 0 | 0 | 0 | 0 | 0 | 0 | 0 | 0 | 0 | 0 | 0 | 0 |
| PS:  | 0 | 0 | 1 | 0 | 0 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | _ | |
|---|------|---|---|---|---|---|---|---|---|---|---|---|---|---|---|
| | MR:  | 0 | 0 | 0 | 0 | 0 | 0 | 0 | 0 | 0 | 0 | 0 | 0 | 0 | Data: d |
| | PS:  | 0 | 0 | 0 | 0 | 0 | 0 | 0 | 0 | 0 | 0 | 0 | 0 | 0 | Data: c |

Again MLA is 1, the match length counter is incremented by 1, and PS is loaded with the Match_Load bits. After cycle 12, the following register conditions pertain:

| CAM: | a | b | c | d | e | f | g | a | b | c | d | e | _ | _ | _ | _ | _ | _ | _ |
|------|---|---|---|---|---|---|---|---|---|---|---|---|---|---|---|---|---|---|---|
| MR:  | 0 | 0 | 0 | 0 | 1 | 0 | 0 | 0 | 0 | 0 | 0 | 0 | 0 | 0 | 0 | 0 | 0 | 0 | 0 |
| PS:  | 0 | 0 | 0 | 1 | 0 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | _ | |
|---|------|---|---|---|---|---|---|---|---|---|---|---|---|---|---|
| | MR:  | 0 | 0 | 0 | 0 | 0 | 0 | 0 | 0 | 0 | 0 | 0 | 0 | 0 | Data: e |
| | PS:  | 0 | 0 | 0 | 0 | 0 | 0 | 0 | 0 | 0 | 0 | 0 | 0 | 0 | Data: d |

After cycle 13, the following register conditions pertain:

| CAM: | a | b | c | d | e | f | g | a | b | c | d | e | w | _ | _ | _ | _ | _ | _ |
|------|---|---|---|---|---|---|---|---|---|---|---|---|---|---|---|---|---|---|---|
| MR:  | 0 | 0 | 0 | 0 | 0 | 0 | 0 | 0 | 0 | 0 | 0 | 0 | 0 | 0 | 0 | 0 | 0 | 0 | 0 |
| PS:  | 0 | 0 | 0 | 0 | 1 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | _ | |
|---|------|---|---|---|---|---|---|---|---|---|---|---|---|---|---|
| | MR:  | 0 | 0 | 0 | 0 | 0 | 0 | 0 | 0 | 0 | 0 | 0 | 0 | 0 | Data: w |
| | PS:  | 0 | 0 | 0 | 0 | 0 | 0 | 0 | 0 | 0 | 0 | 0 | 0 | 0 | Data: e |

At this point, MLA will be '0'. Since MLA is '0', the PS contains the last match position of the longest string, and MR contains the matching conditions of new string. So for this case, the contents of PS and the contents of the match length counter (which is 5 in this case) will be sent to the coding unit, where a compressed token will be generated. Also, the reset match length counter needs to be reset back to 1 and the contents of MR transferred to PS. After this occurs, the matching process can resume on the next cycle. So after cycle 14, the following register conditions pertain:

| CAM: | a | b | c | d | e | f | g | a | b | c | d | e | w | x | _ | _ | _ | _ | _ |
|------|---|---|---|---|---|---|---|---|---|---|---|---|---|---|---|---|---|---|---|
| MR:  | 0 | 0 | 0 | 0 | 0 | 0 | 0 | 0 | 0 | 0 | 0 | 0 | 0 | 0 | 0 | 0 | 0 | 0 | 0 |
| PS:  | 0 | 0 | 0 | 0 | 0 | 0 | 0 | 0 | 0 | 0 | 0 | 0 | 0 | 0 | 0 | 0 | 0 | 0 | 0 |

| | CAM: | _ | _ | _ | _ | _ | _ | _ | _ | _ | _ | _ | _ | _ | |
|---|------|---|---|---|---|---|---|---|---|---|---|---|---|---|---|
| | MR:  | 0 | 0 | 0 | 0 | 0 | 0 | 0 | 0 | 0 | 0 | 0 | 0 | 0 | Data: x |
| | PS:  | 0 | 0 | 0 | 0 | 0 | 0 | 0 | 0 | 0 | 0 | 0 | 0 | 0 | Data: w |

This process continues until after cycle 17:

| CAM: | a | b | c | d | e | f | g | a | b | c | d | e | w | x | y | z | a | _ | _ |
|---|---|---|---|---|---|---|---|---|---|---|---|---|---|---|---|---|---|---|---|
| MR: | 1 | 0 | 0 | 0 | 0 | 0 | 0 | 1 | 0 | 0 | 0 | 0 | 0 | 0 | 0 | 0 | 0 | 0 | |
| PS: | 0 | 0 | 0 | 1 | 0 | 0 | 0 | 0 | 0 | 0 | 0 | 0 | 0 | 0 | 0 | 0 | 0 | 0 | |

| | CAM: | _ | _ | _ | _ | _ | _ | _ | _ | _ | _ | _ | _ | _ | |
|---|---|---|---|---|---|---|---|---|---|---|---|---|---|---|---|
| | MR: | 0 | 0 | 0 | 0 | 0 | 0 | 0 | 0 | 0 | 0 | 0 | 0 | Data: a |
| | PS: | 0 | 0 | 0 | 0 | 0 | 0 | 0 | 0 | 0 | 0 | 0 | 0 | Data: z |

After cycle 18, the following register conditions pertain:

| CAM: | a | b | c | d | e | f | g | a | b | c | d | e | w | x | y | z | a | b | _ |
|---|---|---|---|---|---|---|---|---|---|---|---|---|---|---|---|---|---|---|---|
| MR: | 0 | 1 | 0 | 0 | 0 | 0 | 0 | 0 | 1 | 0 | 0 | 0 | 0 | 0 | 0 | 0 | 0 | 0 | |
| PS: | 1 | 0 | 0 | 0 | 1 | 0 | 0 | 1 | 0 | 0 | 0 | 0 | 0 | 0 | 0 | 0 | 0 | 0 | |

| | CAM: | _ | _ | _ | _ | _ | _ | _ | _ | _ | _ | _ | _ | _ | |
|---|---|---|---|---|---|---|---|---|---|---|---|---|---|---|---|
| | MR: | 0 | 0 | 0 | 0 | 0 | 0 | 0 | 0 | 0 | 0 | 0 | 0 | Data: b |
| | PS: | 0 | 0 | 0 | 0 | 0 | 0 | 0 | 0 | 0 | 0 | 0 | 0 | Data: a |

Now MLA is again 1, so the PS is loaded with the Match_Load bits and increment the match length counter by 1. This process continues until after cycle 21:

| CAM: | a | b | c | d | e | f | g | a | b | c | d | e | w | x | y | z | a | b | c |
|---|---|---|---|---|---|---|---|---|---|---|---|---|---|---|---|---|---|---|---|
| MR: | 0 | 0 | 0 | 0 | 0 | 0 | 0 | 0 | 0 | 0 | 0 | 0 | 1 | 0 | 0 | 0 | 0 | 0 | |
| PS: | 0 | 0 | 0 | 1 | 0 | 0 | 0 | 0 | 0 | 0 | 1 | 0 | 0 | 0 | 0 | 0 | 0 | 0 | |

| | CAM: | d | x | _ | _ | _ | _ | _ | _ | _ | _ | _ | _ | _ | |
|---|---|---|---|---|---|---|---|---|---|---|---|---|---|---|---|
| | MR: | 0 | 0 | 0 | 0 | 0 | 0 | 0 | 0 | 0 | 0 | 0 | 0 | Data: x |
| | PS: | 0 | 0 | 0 | 0 | 0 | 0 | 0 | 0 | 0 | 0 | 0 | 0 | Data: d |

MLA is now 0. PS and the match length counter are then sent to the coding unit. Since there exist 2 equal strings (the strings "abcd" starting at position 0 and 7), the coding unit will pick 1 of them to generate the compressed token. At the same time, the PS is loaded with the contents of MR and the match length counter is also reset to 1. After cycle 22, the following register conditions pertain:

| CAM: | a | b | c | d | e | f | g | a | b | c | d | e | w | x | y | z | a | b | c |
|---|---|---|---|---|---|---|---|---|---|---|---|---|---|---|---|---|---|---|---|
| MR: | 0 | 0 | 0 | 0 | 0 | 0 | 0 | 0 | 0 | 0 | 0 | 0 | 0 | 1 | 0 | 0 | 0 | 0 | |
| PS: | 0 | 0 | 0 | 0 | 0 | 0 | 0 | 0 | 0 | 0 | 0 | 0 | 1 | 0 | 0 | 0 | 0 | 0 | |

| | CAM: | d | x | y | _ | _ | _ | _ | _ | _ | _ | _ | _ | _ | |
|---|---|---|---|---|---|---|---|---|---|---|---|---|---|---|---|
| | MR: | 0 | 0 | 0 | 0 | 0 | 0 | 0 | 0 | 0 | 0 | 0 | 0 | Data: y |
| | PS: | 0 | 0 | 0 | 0 | 0 | 0 | 0 | 0 | 0 | 0 | 0 | 0 | Data: x |

Since MLA is now 1, then another matching string has been found. This string continues (MLA is 1) until after cycle 28:

| CAM: | a | b | c | d | e | f | g | a | b | c | d | e | w | x | y | z | a | b | c |
|---|---|---|---|---|---|---|---|---|---|---|---|---|---|---|---|---|---|---|---|
| MR: | 1 | 0 | 0 | 0 | 0 | 0 | 0 | 1 | 0 | 0 | 0 | 0 | 0 | 0 | 0 | 1 | 0 | 0 | |

| PS: | 0 | 0 | 0 | 0 | 0 | 0 | 0 | 0 | 0 | 0 | 0 | 0 | 0 | 0 | 0 | 0 | 0 | 0 | 0 |   |         |
|-----|---|---|---|---|---|---|---|---|---|---|---|---|---|---|---|---|---|---|---|---|---------|
|     |   |   | CAM: | d | x | y | z | a | b | c | d | a | _ | _ | _ | _ |   |   |   |   |         |
|     |   |   |      | MR: | 0 | 0 | 0 | 0 | 1 | 0 | 0 | 0 | 0 | 0 | 0 | 0 | 0 |   |   | Data: a |
|     |   |   |      | PS: | 1 | 0 | 0 | 0 | 0 | 0 | 0 | 0 | 0 | 0 | 0 | 0 | 0 |   |   | Data: d |

Since MLA is now 0, the contents of PS and the match length counter is sent to the coding unit where a compressed token will be generated. On the next cycle, the control logic for the CAM will produce an End_Of_File signal to tell the MLA circuitry that there is no more data byte, and that the string matching process should be terminated. So after cycle 29, the following register conditions pertain:

| CAM: | a | b | c | d | e | f | g | a | b | c | d | e | w | x | y | z | a | b | c |         |
|------|---|---|---|---|---|---|---|---|---|---|---|---|---|---|---|---|---|---|---|---------|
| MR:  | 0 | 0 | 0 | 0 | 0 | 0 | 0 | 0 | 0 | 0 | 0 | 0 | 0 | 0 | 0 | 0 | 0 | 0 | 0 |         |
| PS:  | 1 | 0 | 0 | 1 | 0 | 0 | 0 | 1 | 0 | 0 | 1 | 0 | 0 | 0 | 0 | 0 | 1 | 0 | 0 |         |
|      |   |   | CAM: | d | x | y | z | a | b | c | d | a | _ | _ | _ | _ |   |   |   |         |
|      |   |   |      | MR: | 0 | 0 | 0 | 0 | 0 | 0 | 0 | 0 | 0 | 0 | 0 | 0 |   |   | Data: _ |
|      |   |   |      | PS: | 0 | 0 | 0 | 0 | 0 | 0 | 0 | 0 | 0 | 0 | 0 | 0 |   |   | Data: a |

At this point, the last 'a' will be sent to the coding unit, where it is coded as a raw byte. After cycle 30, the coding unit will receive the End_Of_File signal, and it will proceed to generate a End_Of_File marker and append that to the end of the output data stream.

This single-byte per cycle encoding process can be generalized to handle 2-bytes per cycle, 3-bytes per cycle, etc.

Two-Character Per Encoding Cycle Using A Variant Of The New Paradigm

Referring now to FIGS. 4A–4C, there are depicted another maximal length pattern matching logic arrangement effectuating two characters per cycle of LZ1977 compression encoding. In two character per cycle compression, the string extension may be done using FORWARD EXHAUSTIVE GREEDY PATTERN MATCHING RECURSION instead of the backward search described in the single character per encoding cycle case. Significantly, the forward search is subject to substantially the same Part 1 and Part 2 constraints as have applied to the backward search.

Assume that the pattern match logic includes a K=3 character byte lookahead buffer. Such would employ a forward constrained search as follows:

TABLE 9

| HISTORY BUFFER | | | | | | | LOOKAHEAD BUFFER K = 3 | | | MATCH LENGTH | MAX-IMAL |
|---|---|---|---|---|---|---|---|---|---|---|---|
| x | y | z | x | x | x | x | x | y | z |  |  |
|  |  |  |  | $\longrightarrow$ |  |  |  |  |  | 1 |  |

In table 9, the forward search results in two actions under the Part 1 constraints. The prefix "xxx" in the history buffer is terminated by appending "x" from the look ahead buffer to it during the first recursion. Since L=1, and L<K+1, then continue processing the forward search according to Part 2 constraints.

TABLE 10

| HISTORY BUFFER | | | | | | | LOOKAHEAD BUFFER K = 3 | | | MATCH LENGTH | MAX-IMAL |
|---|---|---|---|---|---|---|---|---|---|---|---|
| x | y | z | x | x | x | x | x | y | z |  |  |
|  |  |  |  | $\longrightarrow$ |  |  |  |  |  | 1 |  |

In table 10, the recursion starts form one position shifted to the right. The first and longest match is "yz". Thus, K=2, L=2 and J=K−(−L)=K+L=2−(−2)=4. Since J is not less than K, then no further Part 2 recurrence is required. Note, substring "yz" is a prefix capable of further extension.

TABLE 11

| HISTORY BUFFER | | | | | | | LOOKAHEAD BUFFER K = 3 | | | MATCH LENGTH | MAX-IMAL |
|---|---|---|---|---|---|---|---|---|---|---|---|
| x | y | z | x | x | x | x | x | y | z |  |  |
|  |  |  |  | $\longleftarrow$ |  |  |  |  |  | 3 |  |

From table 11, it is clear that the backward search results in termination of "xxx" and a new prefix of "xyz". In contrast, the forward search results in termination of "xxxx" and the new prefix "yz".

Two Character Per Encoding Pattern Matching Logic

Referring again to FIGS. 4A–4C, the content addressable memory (CAM) constitutes the history buffer. Also, terms "Lookaside" and "Lookahead" are used interchangibly.

The embodiment in FIG. 4A includes a sliding window history buffer 605 and compare logic 607. Several elements participate with Match Look-Aside logic 11 as depicted FIG.

2A. As shown in FIG. 4A, these include the write select (WS) register 603, buffer 605, the gate register 604, and the compare circuitry AND/OR logic 677, 679, and 681 in FIG. 4C generate the match results. There are 2 inputs bytes to this circuit, which are labeled as t1 and t2 bytes. If a single byte compression hardware is used to process these 2 bytes, then t1 byte is processed in the first cycle, and t2 byte is processed in the second cycle.

A single '0' is initially stored at WS(0) of Write Select register 603, the rest of WS addresses storing '1'. This '0' position denotes the current two positions in the storage register that the 2 bytes will be written to. If WS(i) is '0', then CAM(2*i) is being written with t1 byte, and CAM(2*i+1) is written with t2 byte. Thus the number of bits in WS is ½ of the locations in the CAM. After every cycle, WS is rotated by 1.

For purposes of this invention, the CAM is taken to include the buffer 605, compare logic 607, gate register 604, and the attendent WS register 603.

The gate register (G) is used to keep track of which positions of the CAM contains valid data. Initially, G is set to 0, and after every cycle, an '1' is shifted into G. Also, since 2 bytes are written every cycle, the number of bits in G is ½ of the locations of the CAM. If G(i) is '0', then CAM(2*i) and CAM(2*i+1) does not yet contain valid data, and the match result for these 2 locations should be masked off.

The t1 byte is always written into the even locations of the CAM, and as t1 byte is being written, it is also compared with every location in the CAM to generate the match conditions. The set of comparators immediately to the right of the CAM are used to compare t1 byte with the CAM. The compare results might need to be masked off, however, and the set of AND gates after the comparators shows the gating of the t1 compare results. The gating for even and odd matches, however, are slightly different.

t1_match(2*i+1)<=compare (CAM(2*i+1), t1_byte) AND G(i);

t1_match (2*i)<=compare (CAM(2*i), t1_byte) AND WS(i) and G(i);

Since t1 byte is never written to the odd locations in the CAM, the compare result is valid if these locations contain previously written data (G='1'). For the even locations, however, the compare result is valid only if these locations contain previously written data (G='1'), and the current compare location is not being written into (WS='1');

The t2 byte is always written into the odd locations of the CAM, and t2 byte also needs to be compared with every location in the CAM. With t2 byte, though, there is a slight change. With the single byte CAM, by the time t2 byte is written to position 2*i+1, the 2*ith position already contain t1 byte. Therefore, t2 byte needs to be compared with every location in the CAM, except for the location immediately below where t2 byte is being written; in this case, t2 byte needs to be compared with t1 byte.

Given the following:

|      | 0 | 1 | 2 | 3 | 4 | 5 | 6 | 7 |
|------|---|---|---|---|---|---|---|---|
| CAM: | a | a | b | c | d | e | f | g | t1 byte: a t2 byte: a t1 byte will be written to location 4 (an even location), and t2 byte will be written to location 5 (an odd location).

The compare result for t1 byte should be 1 1 0 0 0 0 0 0 and the compre result for t2 should be 1 1 0 0 1 0 0 0, and NOT 1 1 0 0 0 0 0 0.

To see why this is necessary, consider a single byte/cycle CAM where t1 byte is processed in cycle 1 and t2 byte is processed in cycle 2. By the time t2 byte is processed, the CAM contains a a b c a e f g.

Since t1 byte is never written to the odd locations of the CAM, t2 byte can be compared with the odd locations of the CAM without modifications. For the even CAM locations, a MUX is used to select whether to compare t2 byte with the contents of the CAM, or with t1 byte. If WS(i)='1', then t2 byte should be compared with CAM(2*i), else if WS(i)='0', t2 byte should be compared with t1 byte.

location(2*i)<=CAM(2*i) when (WS(i)='1') else t1_byte;

location(2*i+1)<=CAM(2*i+1);

Finally, the t2 byte match results might need to be masked off as well.

For the odd locations, the compare result is valid if these locations contain previously written data (G='1'), and the current location is not being written to (WS='1'). For the even locations, the compare result is valid if the previous even location of the CAM contains valid data. When G(i)= '0', this could be because CAM(2*i) and CAM(2*i+1) have not yet been written to, or it might be the case that CAM(2*i) is currently being written with t1 byte, and CAM(2*i+1) is being written with t2 byte. For the first case, t2 match (2*i+1) should be masked, while for the second case, t2 match(2*i+1) should not. By looking at the previous G bit, however, it can be determined which case applies. If the previous G bit is '0', then CAM positions 2*i and 2*i+1 cannot contain valid data, and the compare result must be masked off.

If the previous G bit is '1', however, it means that the CAM locations 2*i and 2*i+1 either contains valid data, or is currently being written; for both of these t2_match(2*i+1) should not be masked off. The other modification needed is for t2_match(O); for this location no gating is necessary.

t2_match(2*i)<=compare(location(2*i), t2_byte) AND G(i-1);

t2_match(2*i+1)<=compare(location(2*i+1), t2_byte) AND G(i) AND WS(i);

t2_match(0)<=compare(location(0), t2_byte);

Two Character Per Cycle Example 1

Suppose there exists a 16 byte CAM, with position 0 on the left and position 15 on the right. The CAM will be written into from left to right using wrap around. Thus, locations 0 and 1 will be written in the first cycle, 2 and 3 in the next cycle, 4 and 5 next, . . . , 14 and 15, then 0 and 1 again, etc. Also, suppose the input stream is "therefore the theme then". The t1 MReg and t2 MReg are the latched registers).

|  | 0 |  |  |  |  |  |  |  |  |  |  |  |  |  | 15 | Look-Ahead Buffer |
|---|---|---|---|---|---|---|---|---|---|---|---|---|---|---|---|---|---|
| (K = 2) CAM: | — | — | — | — | — | — | — | — | — | — | — | — | — | — | — | — | th |
| t2 Mreg: | 0 | 0 | 0 | 0 | 0 | 0 | 0 | 0 | 0 | 0 | 0 | 0 | 0 | 0 | 0 |  | t2 byte |
| t1 Mreg: | 0 | 0 | 0 | 0 | 0 | 0 | 0 | 0 | 0 | 0 | 0 | 0 | 0 | 0 | 0 |  | t1 byte |

After cycle 1:

| CAM: | t | h | — | — | — | — | — | — | — | — | — | — | — | — | — | — | er |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 0 | 0 | 0 | 0 | 0 | 0 | 0 | 0 | 0 | 0 | 0 | 0 | 0 | 0 | |

After cycle 2:

| CAM: | t | h | e | r | — | — | — | — | — | — | — | — | — | — | — | — | ef |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 0 | 0 | 0 | 0 | 0 | 0 | 0 | 0 | 0 | 0 | 0 | 0 | 0 | 0 | |

After cycle 3:

| CAM: | t | h | e | r | e | f | — | — | — | — | — | — | — | — | — | — | or |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 1 | 0 | 0 | 0 | 0 | 0 | 0 | 0 | 0 | 0 | 0 | 0 | 0 | 0 | |

After cycle 4:

| CAM: | t | h | e | r | e | f | o | r | — | — | — | — | — | — | — | — | e |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 0 | 0 | 0 | 0 | 0 | 0 | 0 | 0 | 0 | 0 | 0 | 0 | 0 | 0 | |

After cycle 5:

| CAM: | t | h | e | r | e | f | o | r | e | — | — | — | — | — | — | — | th |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 1 | 0 | 1 | 0 | 0 | 0 | 0 | 0 | 0 | 0 | 0 | 0 | 0 | 0 | |

After cycle 6:

| CAM: | t | h | e | r | e | f | o | r | e | t | h | — | — | — | — | — | e |
|---|---|---|---|---|---|---|---|---|---|---|---|---|---|---|---|---|---|
| t2 MReg: | 0 | 1 | 0 | 0 | 0 | 0 | 0 | 0 | 0 | 0 | 0 | 0 | 0 | 0 | 0 | 0 | |
| t1 MReg: | 1 | 0 | 1 | 0 | 1 | 0 | 0 | 0 | 0 | 0 | 0 | 0 | 0 | 0 | 0 | 0 | |

After cycle 7:

| CAM: | t | h | e | r | e | f | o | r | e | t | h | e | — | — | — | — | th |
|---|---|---|---|---|---|---|---|---|---|---|---|---|---|---|---|---|---|
| t2 MReg: | 0 | 0 | 0 | 0 | 0 | 0 | 0 | 0 | 1 | 0 | 0 | 0 | 0 | 0 | 0 | 0 | |
| t1 MReg: | 0 | 0 | 1 | 0 | 1 | 0 | 0 | 0 | 1 | 0 | 0 | 0 | 0 | 0 | 0 | 0 | |

After cycle 8:

| CAM: | t | h | e | r | e | f | o | r | e | t | h | e | t | h | — | — | em |
|---|---|---|---|---|---|---|---|---|---|---|---|---|---|---|---|---|---|
| t2 MReg: | 0 | 1 | 0 | 0 | 0 | 0 | 0 | 0 | 0 | 0 | 1 | 0 | 0 | 0 | 0 | 0 | |
| t1 MReg: | 1 | 0 | 0 | 0 | 0 | 0 | 0 | 0 | 0 | 1 | 0 | 0 | 0 | 0 | 0 | 0 | |

After cycle 9:

| CAM: | e | m | r | e | f | o | r | e | t | h | e | t | h | — | — | — | e |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 1 | 0 | 1 | 0 | 0 | 0 | 1 | 0 | 0 | 1 | 0 | 0 | 0 | 0 | |

After cycle 10:

| CAM: | e | m | e | — | e | f | o | r | e | t | h | e | t | h | — | — | th |
|---|---|---|---|---|---|---|---|---|---|---|---|---|---|---|---|---|---|
| t2 MReg: | 0 | 0 | 0 | 0 | 0 | 0 | 0 | 0 | 1 | 0 | 0 | 0 | 1 | 0 | 0 | 0 | |
| t1 MReg: | 0 | 0 | 0 | 0 | 1 | 0 | 0 | 0 | 1 | 0 | 0 | 0 | 1 | 0 | 0 | 0 | |

-continued

| | 0 | | | | | | | | | | | | | | | 15 | Look-Ahead Buffer |
|---|---|---|---|---|---|---|---|---|---|---|---|---|---|---|---|---|---|

After cycle 11:

| CAM: | e | m | e | | t | h | o | r | e | | t | h | e | | t | h | en |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 1 | 0 | 0 | 0 | 1 | |
| t1 MReg: | 0 | 0 | 0 | 0 | 0 | 0 | 0 | 0 | 0 | 0 | 1 | 0 | 0 | 0 | 1 | 0 | |

After cycle 12:

| CAM: | e | m | e | | t | h | e | n | e | | t | h | e | | t | h | — |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 1 | 0 | 1 | 0 | 0 | 0 | 0 | 1 | 0 | 0 | 0 | 1 | 0 | 0 | 0 | 0 | |

Two Character Per Cycle Example 2

Suppose that 16 character CAM is used with the input string of:

"abaaaaaa".

| | 0 | | | | | | | | | | | | | | | 15 | Look-Ahead Buffer |
|---|---|---|---|---|---|---|---|---|---|---|---|---|---|---|---|---|---|
| (K = 2) CAM: | _ | _ | _ | _ | _ | _ | _ | _ | _ | _ | _ | _ | _ | _ | _ | _ | ab |
| t2 Mreg: | 0 | 0 | 0 | 0 | 0 | 0 | 0 | 0 | 0 | 0 | 0 | 0 | 0 | 0 | 0 | | ⎿ t2 byte |
| t1 Mreg: | 0 | 0 | 0 | 0 | 0 | 0 | 0 | 0 | 0 | 0 | 0 | 0 | 0 | 0 | 0 | | ⎿ t2 byte |

After cycle 1:

| CAM: | t | h | _ | _ | _ | _ | _ | _ | _ | _ | _ | _ | _ | _ | _ | _ | aa |
|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | |
| t1 MReg: | 0 | 0 | 0 | 0 | 0 | 0 | 0 | 0 | 0 | 0 | 0 | 0 | 0 | 0 | 0 | 0 | |

For this case, t1 byte sees the CAM as containing "a b _ _ _ _ _ _ _ _ _ _ _ _ _ _".

After cycle 2:

| CAM: | a | b | a | a | _ | _ | _ | _ | _ | _ | _ | _ | _ | _ | _ | _ | aa |
|---|---|---|---|---|---|---|---|---|---|---|---|---|---|---|---|---|---|
| t2 MReg: | 1 | 0 | 1 | 0 | 0 | 0 | 0 | 0 | 0 | 0 | 0 | 0 | 0 | 0 | 0 | 0 | |
| t1 MReg: | 1 | 0 | 0 | 0 | 0 | 0 | 0 | 0 | 0 | 0 | 0 | 0 | 0 | 0 | 0 | 0 | |

After cycle 3:

| CAM: | a | b | a | a | a | a | _ | _ | _ | _ | _ | _ | _ | _ | _ | _ | aa |
|---|---|---|---|---|---|---|---|---|---|---|---|---|---|---|---|---|---|
| t2 MReg: | 1 | 0 | 1 | 1 | 1 | 0 | 0 | 0 | 0 | 0 | 0 | 0 | 0 | 0 | 0 | 0 | |
| t1 MReg: | 1 | 0 | 1 | 1 | 0 | 0 | 0 | 0 | 0 | 0 | 0 | 0 | 0 | 0 | 0 | 0 | |

After cycle 4:

| CAM: | a | b | a | a | a | a | a | a | _ | _ | _ | _ | _ | _ | _ | — | |
|---|---|---|---|---|---|---|---|---|---|---|---|---|---|---|---|---|---|
| t2 MReg: | 1 | 0 | 1 | 1 | 1 | 1 | 1 | 0 | 0 | 0 | 0 | 0 | 0 | 0 | 0 | 0 | |
| t1 MReg: | 1 | 0 | 1 | 1 | 1 | 1 | 0 | 0 | 0 | 0 | 0 | 0 | 0 | 0 | 0 | 0 | |

The t2 byte really should see the CAM as containing "a b a _ _ _ _ _ _ _ _ _ _ _ _", The second 'a' is due to t1 byte. The set of muxes 615 feeding the comparators 617 in FIG. 4A is for this purpose. This set of muxes and the corresponding gating logic 610 forms the Look-Ahead logic, or Look-Aside logic. Note that the Look-Ahead Buffer refers the input bytes, while the Look-Ahead Logic refers to the logic that generates the correct match conditions for t2 byte.

Two Character Per Cycle Pattern Match Look-Ahead

The output of first stage (t1_match and t2_match) are latched and fed to the next stage of logic, where the match look-ahead (MLA) conditions are generated. The generation of the MLA signals are shown in FIG. 4C. These are simple extensions of the MLA for the single byte case, and the equations for the 3 MLAs are as follows (for a 8-byte CAM):

M3Load(0)<=PS(6) AND t1MReg(7) AND t2MReg(0);
M3Load(1)<=PS(7) AND t1MReg(0) AND t2MReg(1);
M3Load (2)<=PS(0) AND t1MReg (1) AND t2MReg(2);
M3Load(3)<=PS(1) AND t1MReg(2) AND t2MReg(3);
M3Load(4)<=PS(2) AND t1MReg(3) AND t2MReg(4);
M3Load(5)<=PS(3) AND t1MReg(4) AND t2MReg(5);
M3Load(6)<=PS(4) AND t1MReg(5) AND t2MReg(6);
M3Load(7)<=PS(5) AND t1MReg(6) AND t2MReg(7);
MLA3<=M3Load(0) OR M3Load(1) OR M3Load(2) OR M3Load(3) OR M3Load(4) OR M3Load(5) OR M3Load(6) OR M3Load(7);
M2Load(0)<=t1Mreg(7) AND t2MReg(0);
M2Load(1)<=t1Mreg(0) AND t2MReg(1);
M2Load(2)<=t1Mreg(1) AND t2MReg(2);
M2Load(3)<=t1Mreg(2) AND t2MReg(3);
M2Load(4)<=t1Mreg(3) AND t2MReg(4);
M2Load(5)<=t1Mreg(4) AND t2MReg(5);
M2Load(6)<=t1Mreg(5) AND t2MReg(6);
M2Load(7)<=t1Mreg(6) AND t2MReg(7);
MLA2<=M2Load(0) OR M2Load(1) OR M2Load(2) OR M2Load(3) OR M2Load(4) OR M2Load(5) OR M2Load(6) OR M2Load(7);
M1Load(0)<=PS(7) AND t1MReg(0);
M1Load(1)<=PS(0) AND t1MReg(1);
M1Load(2)<=PS(1) AND t1MReg(2);
M1Load(3)<=PS(2) AND t1MReg(3);
M1Load(4)<=PS(3) AND t1MReg(4);
M1Load(5)<=PS(4) AND t1MReg(5);
M1Load(6)<=PS(5) AND t1MReg(6);
M1Load(7)<=PS(6) AND t1MReg(7);
MLA1<=M1Load(0) OR M1Load(1) OR M1Load(2) OR M1Load(3) OR M1Load(4) OR M1Load(5) OR M1Load(6) OR M1Load(7);
MLA3=MLA(0,2), MLA=MLA(1,2), MLA1=MLA(0,1).

PS is the prefix extension, or primary select register, and t1MReg and t2MReg are the registers that are used to store the t1 and t2 Match conditions. The MLAs can be generated for any size of CAM. In the following example, the string matching process is done from the FORWARD direction.

Two Character Per Cycle Example 3

Suppose that the CAM stores 16 character bytes, and the input string is "xyzxxxxxxxyz".

| (K = 2) | 0 | | | | | | | | | | | | | | | 15 | Look-Ahead Buffer |
|---|---|---|---|---|---|---|---|---|---|---|---|---|---|---|---|---|---|
| CAM: | — | — | — | — | — | — | — | — | — | — | — | — | — | — | — | — | xy |
| t2 Mreg: | 0 | 0 | 0 | 0 | 0 | 0 | 0 | 0 | 0 | 0 | 0 | 0 | 0 | 0 | 0 | t2 BReg: | — |
| t1 Mreg: | 0 | 0 | 0 | 0 | 0 | 0 | 0 | 0 | 0 | 0 | 0 | 0 | 0 | 0 | 0 | t1 BReg: | — |
| PS: | 0 | 0 | 0 | 0 | 0 | 0 | 0 | 0 | 0 | 0 | 0 | 0 | 0 | 0 | 0 | PS Byte: | — |
| Length: | 1 | | | | | | | | | | | | | | | | |

Note that the match length is preset to 1, and that the t1 byte will be stored in the t1 BReg register, and t2 byte will be stored in the t2 BReg register.

| After cycle 1: | | | | | | | | | | | | | | | | | |
|---|---|---|---|---|---|---|---|---|---|---|---|---|---|---|---|---|---|
| CAM: | x | y | — | — | — | — | — | — | — | — | — | — | — | — | — | | zx |
| t2 MReg: | 0 | 0 | 0 | 0 | 0 | 0 | 0 | 0 | 0 | 0 | 0 | 0 | 0 | 0 | 0 | t2 BReg: | y |
| t1 MReg: | 0 | 0 | 0 | 0 | 0 | 0 | 0 | 0 | 0 | 0 | 0 | 0 | 0 | 0 | 0 | t1 BReg: | x |
| PS: | 0 | 0 | 0 | 0 | 0 | 0 | 0 | 0 | 0 | 0 | 0 | 0 | 0 | 0 | 0 | PS Byte: | — |
| Length: | 1 | | | | | | | | | | | | | | | | |

In this case, MLA3-1 are all 0, so the string stored in the PS is the longest string that has so far been found, and t1 BReg is a raw byte. Since PS Byte does not contain any valid data, there is no need to encode it. Also, t1 BReg has just been sent to the coding unit as a raw byte. Next, t2 Breg to PS Byte and t2 MReg to PS are now copied, since 'y' represents a start of a new string.

| After cycle 2: | | | | | | | | | | | | | | | | | |
|---|---|---|---|---|---|---|---|---|---|---|---|---|---|---|---|---|---|
| CAM: | x | y | z | x | — | — | — | — | — | — | — | — | — | — | — | | xx |
| t2 MReg: | 1 | 0 | 0 | 0 | 0 | 0 | 0 | 0 | 0 | 0 | 0 | 0 | 0 | 0 | 0 | t2 BReg: | x |
| t1 MReg: | 0 | 0 | 0 | 0 | 0 | 0 | 0 | 0 | 0 | 0 | 0 | 0 | 0 | 0 | 0 | t1 BReg: | z |
| PS: | 0 | 0 | 0 | 0 | 0 | 0 | 0 | 0 | 0 | 0 | 0 | 0 | 0 | 0 | 0 | PS Byte: | y |
| Length: | 1 | | | | | | | | | | | | | | | | |

In this case MLA3-1 are all 0, so PS, PS Byte, and Length are sent to the coding unit, where because Length is 1, the PS Byte will be coded as a raw byte. Also, t1 BReg is sent to the coding unit as a raw character or byte. The register contents are now copied such that t2 MReg is copied to PS, and t2 BReg is copied to PS Byte.

After cycle 3:

| CAM: | x | y | z | x | x | x | | | | | | | | | | | | xx |
|---|---|---|---|---|---|---|---|---|---|---|---|---|---|---|---|---|---|---|
| t2 MReg: | 1 | 0 | 0 | 1 | 1 | 0 | 0 | 0 | 0 | 0 | 0 | 0 | 0 | 0 | 0 | 0 | t2 BReg: | x |
| t1 MReg: | 1 | 0 | 0 | 1 | 0 | 0 | 0 | 0 | 0 | 0 | 0 | 0 | 0 | 0 | 0 | 0 | t1 BReg: | x |
| PS: | 1 | 0 | 0 | 0 | 0 | 0 | 0 | 0 | 0 | 0 | 0 | 0 | 0 | 0 | 0 | 0 | PS Byte: | x |
| Length: | 1 | | | | | | | | | | | | | | | | | |

In this case, MLA3=0, it follows that t1 BReg and t2 Breg are not both part of the string that is currently stored in the PS. Since searching is being executed in the forward direction, it is desired to determine if t1 BReg is part of the string that is stored in the PS. Since MLA1 is 0, however, t1 BReg is not part of the string in the PS. So now it is known that the string stored in PS has terminated, and the PS, PS Byte, and length are sent to the coding unit so that PS Byte can be properly coded. Now a check run on MLA2, and MLA2 is 1. This reveals that t1 BReg and t2 BReg forms a string that is at least 2 characters long. Since this string might be extended, Length is set to 2, t2 BReg is copied to PS Byte, and M2Load is copied to PS.

Now both MLA3 and MLA1 are 0, so the string stored in PS has ended. PS, PS Byte, and Length are now sent to the coding unit. Since MLA2 is 1, the string that has at least length of 2. Thus, so the Length is to 2, t2 BReg to PS Byte, M2Load to PS.

After cycle 4:

| CAM: | x | y | z | x | x | x | x | x | | | | | | | | | | xx |
|---|---|---|---|---|---|---|---|---|---|---|---|---|---|---|---|---|---|---|
| t2 MReg: | 1 | 0 | 0 | 1 | 1 | 1 | 1 | 0 | 0 | 0 | 0 | 0 | 0 | 0 | 0 | 0 | t2 BReg: | x |
| t1 MReg: | 1 | 0 | 0 | 1 | 1 | 1 | 0 | 0 | 0 | 0 | 0 | 0 | 0 | 0 | 0 | 0 | t1 BReg: | x |
| PS: | 0 | 0 | 0 | 0 | 1 | 0 | 0 | 0 | 0 | 0 | 0 | 0 | 0 | 0 | 0 | 0 | PS Byte: | x |
| Length: | 2 | | | | | | | | | | | | | | | | | |

In this case, MLA3=1, this means that t1 BReg and t2 BReg are part of the string that is stored in PS. The Length is incremented by 2, t2 BReg is copied to PS Byte, and M3Load is copied to PS. No character is sent to the coding unit, since the end of a string has not yet been found. Also, for this case MLA1 and MLA2 are also 1, but since we are looking for the longest match, MLA3 has priority over MLA1 and MLA2.

After cycle 5:

| CAM: | x | y | z | x | x | x | x | x | x | x | | | | | | | | yz |
|---|---|---|---|---|---|---|---|---|---|---|---|---|---|---|---|---|---|---|
| t2 MReg: | 1 | 0 | 0 | 1 | 1 | 1 | 1 | 1 | 1 | 0 | 0 | 0 | 0 | 0 | 0 | 0 | t2 BReg: | x |
| t1 MReg: | 1 | 0 | 0 | 1 | 1 | 1 | 1 | 1 | 0 | 0 | 0 | 0 | 0 | 0 | 0 | 0 | t1 BReg: | x |
| PS: | 0 | 0 | 0 | 0 | 0 | 0 | 1 | 0 | 0 | 0 | 0 | 0 | 0 | 0 | 0 | 0 | PS Byte: | x |
| Length: | 4 | | | | | | | | | | | | | | | | | |

In this case, MLA3 is again 1, so Length is incremented by 2, t2 BReg copied to PS Byte, and M3Load copied to PS.

After cycle 6:

| CAM: | x | y | z | x | x | x | x | x | x | x | y | z | | | | | | — |
|---|---|---|---|---|---|---|---|---|---|---|---|---|---|---|---|---|---|---|
| t2 MReg: | 0 | 0 | 1 | 0 | 0 | 0 | 0 | 0 | 0 | 0 | 0 | 0 | 0 | 0 | 0 | 0 | t2 BReg: | z |
| t1 MReg: | 0 | 1 | 0 | 0 | 0 | 0 | 0 | 0 | 0 | 0 | 0 | 0 | 0 | 0 | 0 | 0 | t1 BReg: | y |
| PS: | 0 | 0 | 0 | 0 | 0 | 0 | 0 | 1 | 0 | 0 | 0 | 0 | 0 | 0 | 0 | 0 | PS Byte: | x |
| Length: | 6 | | | | | | | | | | | | | | | | | |

After cycle 7:

| CAM: | x | y | z | x | x | x | x | x | x | y | z | _ | _ | _ | _ | | | _ |
|---|---|---|---|---|---|---|---|---|---|---|---|---|---|---|---|---|---|---|
| t2 MReg: | 0 | 0 | 0 | 0 | 0 | 0 | 0 | 0 | 0 | 0 | 0 | 0 | 0 | 0 | 0 | 0 | t2 BReg: | _ |
| t1 MReg: | 0 | 0 | 0 | 0 | 0 | 0 | 0 | 0 | 0 | 0 | 0 | 0 | 0 | 0 | 0 | 0 | t1 BReg: | _ |
| PS: | 0 | 0 | 1 | 0 | 0 | 0 | 0 | 0 | 0 | 0 | 0 | 0 | 0 | 0 | 0 | 0 | PS Byte: | z |
| Length: | 2 | | | | | | | | | | | | | | | | | |

Now MLA3-1 are 0, so the string stored in the PS has ended. The PS, PS Byte, and Length are now sent to the coding unit. Since there the string of input characters/bytes is exhausted, the process is now terminated.

Instead of looking across 2 bytes as in the 1-byte CAM, for the 2-byte CAM the match look-ahead must be across 3 bytes. After the MLA's have been generated, the loading of the PS register can be controlled as follows. The generation of the MLA's and the control signals correspond to the Match Extension Logic depicted in FIG. 3.

Referring now to FIG. 4C there is shown the data path and processing logic necessary for loading the PS Latch and the match length counter. The logic arrangement set out in FIGS. 4A–4C is a circuit logic implementation of the data flow logic of the Match Extension Logic and Prefix Register in FIG. 3.

Referring now to FIGS. 5A and 5B, there is shown the flow of control and selected register states included in forming the match lookahead (MLA) signals in the two character per cycle pattern matching embodiment. These depict the steps taken in the two character per cycle processing case, show the state of the MLA signals, and are included for purposes of completeness.

Forward Or Backward Exhaustive Greedy Recursive Searching

In order to process multiple bytes per cycle, the entire set of MLA signals has to be generated. Since the entire set of MLA signals are available, we can search either forward or backward by changing the order in which we test the MLA signals.

For example, for the 2 character byte per cycle case, there exist three MLA signals, namely, MLA3, MLA2, and MLA1. It is necessary to first test to see if MLA3 is 1. If MLA3 is 1, then the longest match has been found and there is no need to test for MLA1 and MLA2. If MLA3 is 0, we need to test MLA1 and MLA2.

If MLA2 is tested first, then a backward search is being performed. In contrast, if MLA1 is tested first, then a forward search is being processed.

Extensions

One extension to the method and means of this invention is setting the character capacity K of the number of characters to be processed per cycle being equal to three or higher. Also, the forward search can be extended to cover this range. In this regard, reference should be made to FIG. 6. This figure depicts a flow of control and the selected MLA signal states in a three character per encoding cycle embodiment.

These and other extensions of the invention may be made without departing from the spirit and scope thereof as recited in the appended claims.

We claim:

1. A cyclic computer implemented method for providing pattern match indication between substrings of a first character string stored in a sliding window history buffer and substrings of a second character string stored in a lookahead buffer, comprising the steps of:

(a) during each cycle, simultaneously parsing two or more maximal length substrings including any substring prefix extending from the first to the second character string by executing an exhaustive comparison match over and between the first and second strings in the buffers consistently in a selected one of either a forward or backward direction across an ordered set of nested intervals;

(b) continuing or terminating a previous string prefix parsed during step (a) according as to whether the characters continue to match over a recursion interval in the set next in order; and (c) determining a new prefix for the next cycle from the parsed substrings.

2. The method according to claim 1, wherein in step (a) the recursive greedy comparison match is in the backward direction and further includes parsing any substrings in the lookahead buffer.

3. A cyclic computer implemented method for providing pattern match indication between substrings of a first character string stored in a sliding window history buffer and substrings of a second character string stored in a lookahead buffer, comprising the steps of:

(a) during each cycle, simultaneously ascertaining two or more maximal substring pattern matches between characters of the second string and characters of the first string including any prefix extensions from the first to the second strings by executing an exhaustive comparison match in the same direction consistently on substrings of characters over and between said second and first strings;

(b) denoting the locations of any ascertained maximal substring pattern matches in the look-ahead and history buffers, and transferring the characters terminating a prefix extension during the cycle from the lookahead buffer to the history buffer; and (c) repeating step (b) until the second character string becomes exhausted.

4. The method according to claim 3, wherein in step (a) the recursion direction is backward and emanating over characters of the second string in the lookahead buffer in a nested order of increasing numbers of characters extending through and including characters of the first string in the history buffer.

5. The method according to claim 3, wherein in step (a) the recursion direction is forward and emanating over characters of the first string in the history buffer in a nested order of increasing numbers of characters extending through and including characters of the second string in the lookahead buffer.

6. A computer implemented method for providing pattern match indication between a first character string stored in a sliding window history buffer and a second string of characters stored in a lookahead buffer, comprising the steps of:

(a)(1) during each cycle, simultaneously ascertaining two or more maximal substring pattern matches between and among characters of the second string and characters of the first string including any prefix extensions from the first to the second strings by executing a backward exhaustive comparison match on substrings of characters over and between said second and first strings located in the buffers; and (2) denoting the locations of any ascertained maximal substring pattern matches in the look-ahead and history buffers, and, transferring the characters processed during the cycle from the look-ahead buffer to the history buffer.

7. The method according to either claim 3 or claim 6, further comprising the steps of:

after the step of denoting and before the step of repeating, appending a pointer to an output string responsive to a signal indicative of the location of maximal pattern match termination, said pointer indicating the prior occurrence of the matched pattern in the sliding window history buffer, a pattern string match of null length being appended to the output string as a token and raw character.

8. The method according to claim 6, wherein step (a1) further includes the step of ascertaining any maximal substring pattern matches among characters of the second string in the lookahead buffer by recursively executing a backward exhaustive greedy search therefor.

9. A computer implemented method for providing pattern match indication between a first character string $b=b_1,b_2,\ldots,b_k$ stored in a sliding window history buffer and an input string $a=a_1,a_2,\ldots,a_i,a_{i+1},\ldots$, said method being operable at the rate of one character per recursion, comprising the steps of:

(a) during an i-th recursion, comparison matching $a_i$ from the input string in parallel with the contents b of the history buffer, writing a Boolean value $m_i$ connoting a character match or mismatch into each counterpart stage of a first shift register, and writing $a_i$ into said history buffer;

(b) during an (i+1)st recursion, repeating step (a), $a_{i+1}$ being the next input string character, concurrently writing the Boolean value $m_i$ from each stage of the first shift register into a counterpart stage of a second shift register offset by a predetermined number of stages, writing the Boolean value $m_{i+1}$ into the first shift register, and forming a Boolean signal as a disjunction of ($m_i$ AND $m_{i+1}$) summed over each pair of stages of the first and second shift registers such that a Boolean value of a first kind is indicative of pattern match continuation and a Boolean value of a second kind is indicative of pattern match termination; and (c) repeating steps (a) and (b) until the input character string terminates.

10. A computer implemented method for compressing an input string $a=a_1,a_2,\ldots,a_i,a_{i+1},\ldots$, into a partially ordered output string at the rate of one character per encoding cycle, comprising the steps of:

(a) during an i-th recursion, comparison matching $a_i$ from the input string in parallel with the contents $b=b_i,b_2,\ldots,b_k$ of a sliding window history buffer, writing a Boolean value $m_i$ connoting a match or mismatch into each counterpart stage of a first shift register, and shifting $a_i$ into the history buffer;

(b) during an (i+1)st recursion, repeating step (a) with respect to the next input character $a_{i+1}$, concurrently writing the contents $m_i$ from the first shift register into counterpart stages of a second shift register offset by a predetermined number of stages, writing the Boolean value $m_{i+1}$ into the first register, and forming a Boolean signal as a disjunction of ($m_i$ AND $m_{i+1}$) summed over each stage of the first and second registers such that a Boolean value of a first kind is indicative of pattern match continuation and a Boolean value of a second kind is indicative of pattern match termination;

(c) appending a pointer to the output string responsive to the signal indicative of pattern match termination, said pointer indicating the prior occurrence of the matched pattern in the sliding window history buffer, a pattern string match of null length being appended to the output string as a token and raw character; and (d) repeating steps (a) through (c) until the input character string becomes exhausted.

11. The method according to claim 10, wherein a current portion of the input string of characters is located in a lookahead buffer, and further wherein steps (a) and (b) include the substeps of executing the respective recursions in a backward direction and emanating over characters of the input string in the lookahead buffer in a nested order of increasing numbers of characters extending through and including characters of the string located in the history buffer.

12. A cyclic computer implemented method for providing K character pattern match indication between substrings of a first character string stored in a sliding window history buffer and substrings of a second character string stored in a lookahead buffer, comprising during each cycle the steps of:

(a) parsing one or more maximal length substrings including any substring prefix extending from the first to the second character string by executing a recursive exhaustive greedy comparison match over and between the first and second strings in the buffers consistently in a selected one of either a forward or backward direction across an ordered set of nested recursion intervals, step (a) further including the substeps of:

(1) updating a prefix register with a K+1 character prefix extension if a backward or forward greedy comparison match results in a match length L=K+1, (2) updating the prefix register with the longest match found, assigning a tracking variable J=(K−L) if the match length L<K+1 and if the longest match L=1, (3) if J>0 for a backward recursive comparison match or if J<K for a forward comparison match, identifying the longest pattern matching length L' between the first and second strings by re-executing a recursive exhaustive greedy comparison match over and between the first and second strings in the buffers in the same direction as originally executed until either L'=J+1, terminating the pattern matching, or, recurring the pattern match on this substep;

(b) denoting the locations of any ascertained maximal substring pattern matches in the look-ahead and history buffers, transferring the characters terminating a prefix extension during the cycle from the lookahead buffer to the history buffer, and rendering the prefix register contents available for processing external to the method; and (c) repeating steps (a) and (b) until the second character string becomes exhausted.

13. The method according to claim 12, wherein the K constitutes any positive integer number of characters less than the second character string length.

14. The method according to claim 12, wherein said method further comprises the steps of:

(d) appending a pointer to an output string responsive to a signal indicative of the location of maximal pattern match termination as resident in the prefix register, said pointer indicating the prior occurrence of the matched pattern in the sliding window history buffer, a pattern string match of null length being appended to the output string as a token and raw character.

15. A cyclic apparatus for providing pattern match indication between substrings of a first character string stored in a sliding window history buffer and substrings of a second character string stored in a lookahead buffer, said apparatus comprising means for transferring a predetermined number of characters from the lookahead buffer and displacing a like number the oldest characters in the history buffer, said apparatus further comprising means for simultaneously parsing two or more maximal length substrings including any substring prefix extending from the first to the second character string by executing an exhaustive comparison match over and between the first and second strings in the buffers consistently in a selected one of either a forward or backward direction in a single cycle;

means for continuing or terminating a previous string prefix parsed by the means for parsing according as to whether the characters continue to match over the recursion interval in the set next in order, said means including means for transferring the number of characters terminating a prefix extension in the second string in the lookahead buffer to the history buffer; and means for determining a new prefix for the next cycle from the parsed substrings.

16. In a system having a content addressable memory (CAM) for storing recent past characters in a string and a look ahead buffer for storing characters currently being processed and pattern matching means for ascertaining the locations in the CAM having a pattern of recent past characters matching a pattern of characters in the look ahead buffer, wherein the improvement comprises:

(a) means including the pattern matching means for simultaneously parsing two or more maximal length substrings including any substrings within the lookahead buffer and any substring prefix of characters extending from the lookahead buffer to the CAM by executing a backward exhaustive comparison match over and between the character string located in the lookahead buffer and the character string located in the CAM in a single cycle;

(b) means for denoting the locations of any ascertained maximal substring pattern matches in the look-ahead buffer and the CAM, tranferring the characters terminating a prefix extension during the cycle from the lookahead buffer to CAM, and rendering the prefix register contents available for processing external to the system; and (c) means for invoking the parsing means and the location denoting means until the second character string becomes exhausted.

* * * * *